(12) United States Patent
Sills et al.

(10) Patent No.: US 8,357,582 B2
(45) Date of Patent: Jan. 22, 2013

(54) METHODS OF FORMING ELECTRICAL COMPONENTS AND MEMORY CELLS

(75) Inventors: Scott E. Sills, Boise, ID (US); Roy E. Meade, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 70 days.

(21) Appl. No.: 12/917,333

(22) Filed: Nov. 1, 2010

(65) Prior Publication Data
US 2012/0108028 A1    May 3, 2012

(51) Int. Cl.
*H01L 21/02* (2006.01)
(52) U.S. Cl. .................... 438/381; 257/E21.003
(58) Field of Classification Search .................. None
See application file for complete search history.

(56) References Cited

U.S. PATENT DOCUMENTS

| | | | |
|---|---|---|---|
| 6,913,937 | B2 | 7/2005 | Natori et al. |
| 7,687,793 | B2 | 3/2010 | Harshfield et al. |
| 2008/0203377 | A1 | 8/2008 | Choi et al. |
| 2009/0166609 | A1 | 7/2009 | Schricker et al. |
| 2009/0189137 | A1 | 7/2009 | Kinoshita et al. |
| 2009/0227092 | A1 | 9/2009 | Fournier et al. |
| 2009/0250735 | A1 | 10/2009 | Asao |
| 2010/0221879 | A1 | 9/2010 | Kuh et al. |
| 2011/0298067 | A1* | 12/2011 | Ishiwata et al. ............... 257/421 |

FOREIGN PATENT DOCUMENTS
WO   PCT/US2011/056281   5/2012

OTHER PUBLICATIONS

Baerns et al., "Bridging the pressure and material gap in the catalytic ammonia oxidation: structural and catalytic properties of different platinum catalysts", Science Direct, Journal of Catalysis (online), 232, pp. 226-238, available online Apr. 12, 2005.

* cited by examiner

*Primary Examiner* — Seahvosh Nikmanesh
(74) *Attorney, Agent, or Firm* — Wells St. John P.S.

(57) ABSTRACT

Some embodiments include methods of forming electrical components. First and second exposed surface configurations are formed over a first structure, and material is then formed across the surface configurations. The material is sub-divided amongst two or more domains, with a first of the domains being induced by the first surface configuration, and with a second of the domains being induced by the second surface configuration. A second structure is then formed over the material. The first domains of the material are incorporated into electrical components. The second domains may be replaced with dielectric material to provide isolation between adjacent electrical components, or may be utilized as intervening regions between adjacent electrical components.

13 Claims, 35 Drawing Sheets

US 8,357,582 B2

METHODS OF FORMING ELECTRICAL COMPONENTS AND MEMORY CELLS

TECHNICAL FIELD

Methods of forming electrical components and memory cells.

BACKGROUND

A continuing goal of semiconductor processing is to increase integration density. Such goal extends to fabrication of numerous types of circuitry, including memory, logic and sensors. Significant improvement in integrated circuit density may be achieved by reducing the size of individual structures in layouts in which there are a large number of repeating units, such as with integrated memory. The individual structures of integrated memory may be comprised by memory-storage units. Example memory-storage units are NAND unit cells, dynamic random access (DRAM) unit cells, and cross-point memory unit cells.

Integrated circuitry is often fabricated by first forming one or more layers that are intended to be incorporated into circuit components, then creating a patterned mask over the layers, and finally transferring a pattern from the mask into the layers to create desired structures from the layers. Numerous problems may be associated with this conventional method of forming circuit components. For instance, the transfer of the pattern from the mask into the various layers will utilize one or more etches which are intended to remove unmasked portions of the layers selectively relative to masked portions of the layers. However, some materials can be particularly difficult to etch into a desired pattern, or may be damaged by the chemical exposure to the etch conditions. These materials include chalcogenides, perovskites, noble metals and many other materials that are presently of interest for utilization in integrated circuitry.

It would be desirable to develop new methods for patterning materials during integrated circuit fabrication, and it would be further desirable for such new methods to be applicable for the patterning of chalcogenides, perovskites, noble metals and other materials.

BRIEF DESCRIPTION OF THE DRAWINGS

FIG. 2 is along the lines 2-2 of FIGS. 1 and 3, and FIG. 3 is along the lines 3-3 of FIGS. 1 and 2.

FIG. 5 is along the lines 5-5 of FIGS. 4 and 6, and FIG. 6 is along the lines 6-6 of FIGS. 4 and 5.

FIG. 8 is along the lines 8-8 of FIGS. 7 and 9, and FIG. 9 is along the lines 9-9 of FIGS. 7 and 8.

FIG. 11 is along the lines 11-11 of FIGS. 10 and 12, and FIG. 12 is along the lines 12-12 of FIGS. 10 and 11.

FIG. 14 is along the lines 14-14 of FIGS. 13 and 15, and FIG. 15 is along the lines 15-15 of FIGS. 13 and 14.

FIG. 17 is along the lines 17-17 of FIGS. 16 and 18, and FIG. 18 is along the lines 18-18 of FIGS. 16 and 17.

FIG. 20 is along the lines 20-20 of FIGS. 19 and 21, and FIG. 21 is along the lines 21-21 of FIGS. 19 and 20.

FIG. 23 is along the lines 23-23 of FIGS. 22 and 24, and FIG. 24 is along the lines 24-24 of FIGS. 22 and 23.

FIG. 26 is along the lines 26-26 of FIGS. 25 and 27, and FIG. 27 is along the lines 27-27 of FIGS. 25 and 26.

FIG. 29 is along the lines 29-29 of FIGS. 28 and 30, and FIG. 30 is along the lines 30-30 of FIGS. 28 and 29.

FIG. 32 is along the lines 32-32 of FIGS. 31 and 33, and FIG. 33 is along the lines 33-33 of FIGS. 31 and 32.

FIG. 36 is along the lines 36-36 of FIGS. 35 and 37, and FIG. 37 is along the lines 37-37 of FIGS. 35 and 36.

FIG. 39 is along the lines 39-39 of FIGS. 38 and 40, and FIG. 40 is along the lines 40-40 of FIGS. 38 and 39.

FIG. 42 is along the lines 42-42 of FIGS. 41 and 43, and FIG. 43 is along the lines 43-43 of FIGS. 41 and 42.

FIG. 45 is along the lines 45-45 of FIGS. 44 and 46, and FIG. 46 is along the lines 46-46 of FIGS. 44 and 45.

FIG. 48 is along the lines 48-48 of FIGS. 47 and 49, and FIG. 49 is along the lines 49-49 of FIGS. 47 and 48.

FIG. 51 is along the lines 51-51 of FIGS. 50 and 52, and FIG. 52 is along the lines 52-52 of FIGS. 50 and 51.

DETAILED DESCRIPTION OF THE ILLUSTRATED EMBODIMENTS

Figure 1:
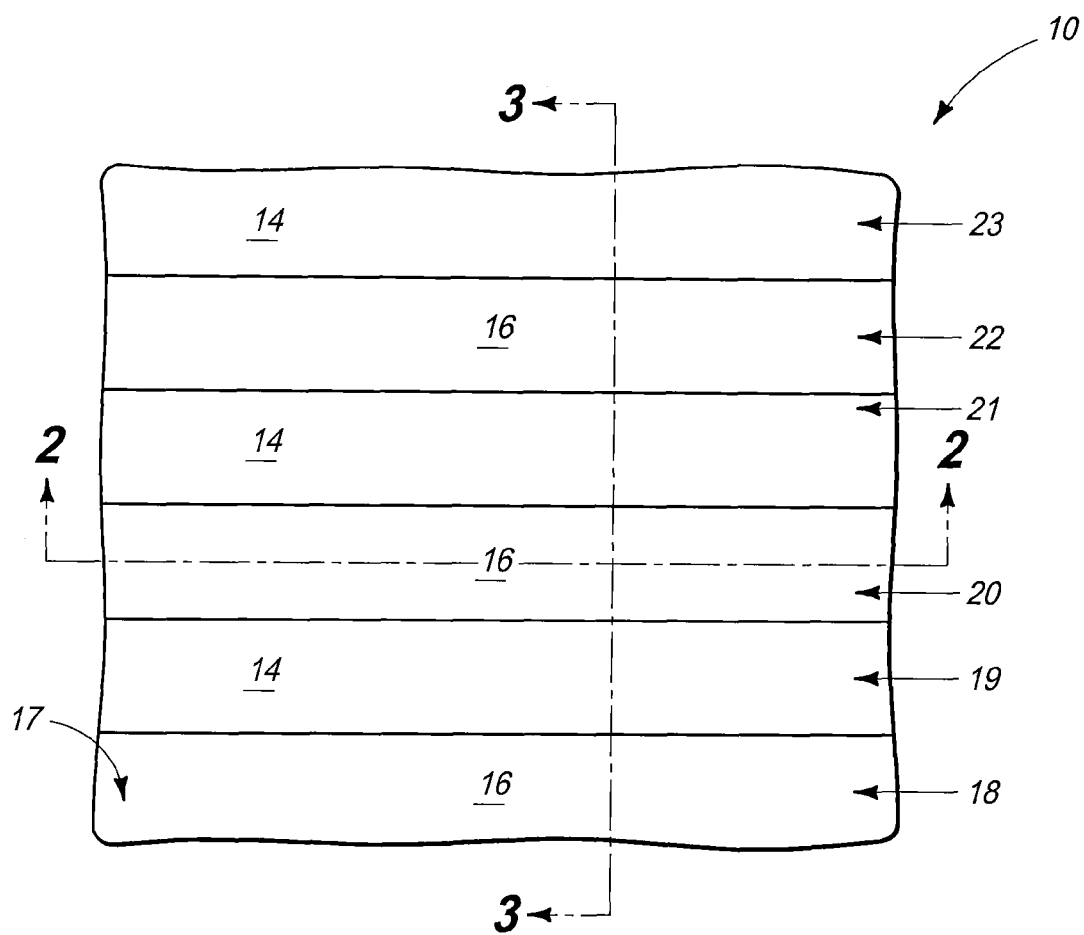
FIGS. 1-3 show a top view and cross-sectional side views of a portion of a semiconductor fragment at a process stage of an example embodiment method.

In some embodiments the invention includes methods of using surface modification to form two or more different surface configurations. Material is then deposited over the surface, and the different surface configurations induce two or more different domains within the deposited material. The surface configurations may be structurally different from one another, and/or may be chemically different from one another.

One of the domains induced in the deposited material may be referred to as a first domain, and another of the domains may be referred to as a second domain. In some embodiments the first domain may be suitable for incorporation into electrical components, and the second domain may be suitable for incorporation into intervening regions that reduce cross-talk between adjacent electrical components (for instance, suitable to provide electrical isolation between adjacent electrical components), and/or may be suitable for selective removal relative to the first domain. The domain suitable for incorporation into electrical components may have any composition and configuration suitable for utilization in desired electrical components. For example, such domain may contain conductive material suitable for incorporation into interconnects or local conductors, may contain diode material (for instance, appropriately-doped semiconductor material, appropriate metal oxide, etc.) suitable for incorporation into select devices, may contain programmable material (for instance, chalcogenide, perovskite, etc.) suitable for incorporation into memory cells, etc.

The domains suitable for incorporation into electrical components may differ from the domains of the intervening regions in any suitable characteristic. For instance, in example embodiments the domains may differ from one another in one or more of stoichiometry, phase, amount of crystallinity, crystalline orientation, grain orientation, etc. Example materials that may be utilized in some embodiments to have two or more domains induced into them during a deposition process are chalcogenides, transition metal oxides, perovskites, borates, crystalline polymers, liquid crystals, noble metals, noble-metal containing materials, molecular monolayers, etc. It is noted that any of the listed materials may be doped in some applications. It is also noted that some of the listed materials may be deposited to have at least one domain containing a crystalline phase in some embodiments.

There can be significant advantages for simultaneously inducing one domain of a deposited material to be suitable for incorporation into integrated circuit devices while inducing another domain to be suitable for incorporation into intervening regions that reduce cross-talk between adjacent circuit devices (e.g., for electrically isolating adjacent circuit devices from one another). For instance, such can enable integrated circuit domains and intervening domains to be simultaneously formed and patterned in a deposition process, and thus can avoid problematic etching and/or polishing processes of conventional fabrication sequences.

Figure 50:
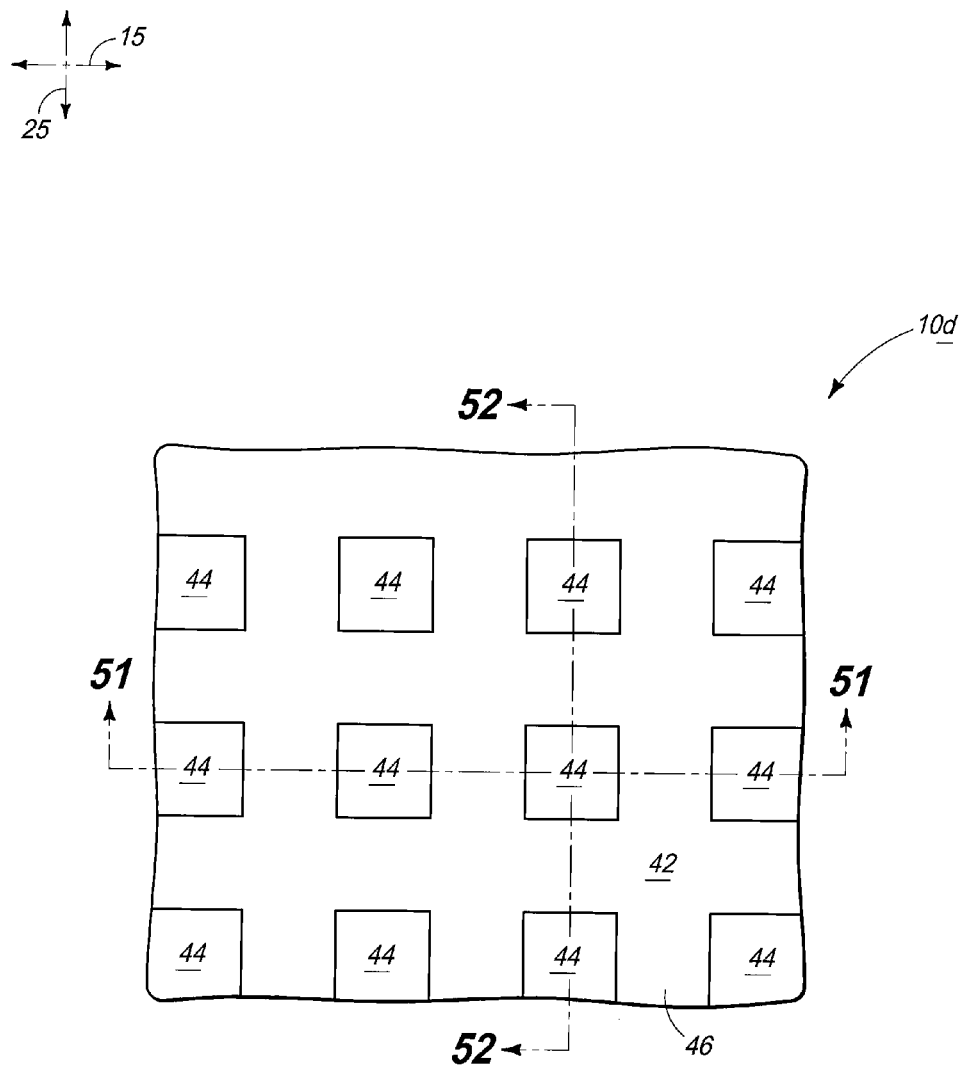
FIGS. 50-52 show a top view and cross-sectional side views of the portion of the semiconductor fragment of FIGS. 44-46 at a process stage subsequent to that of FIGS. 47-49.
Figure 51:
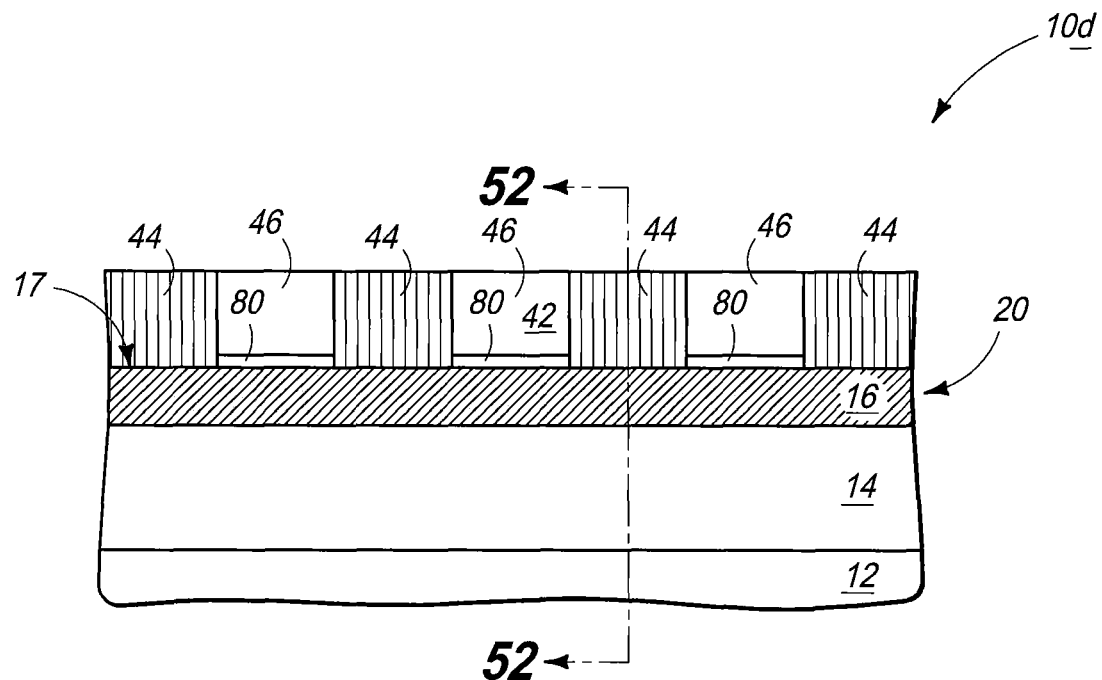
Figure 52:
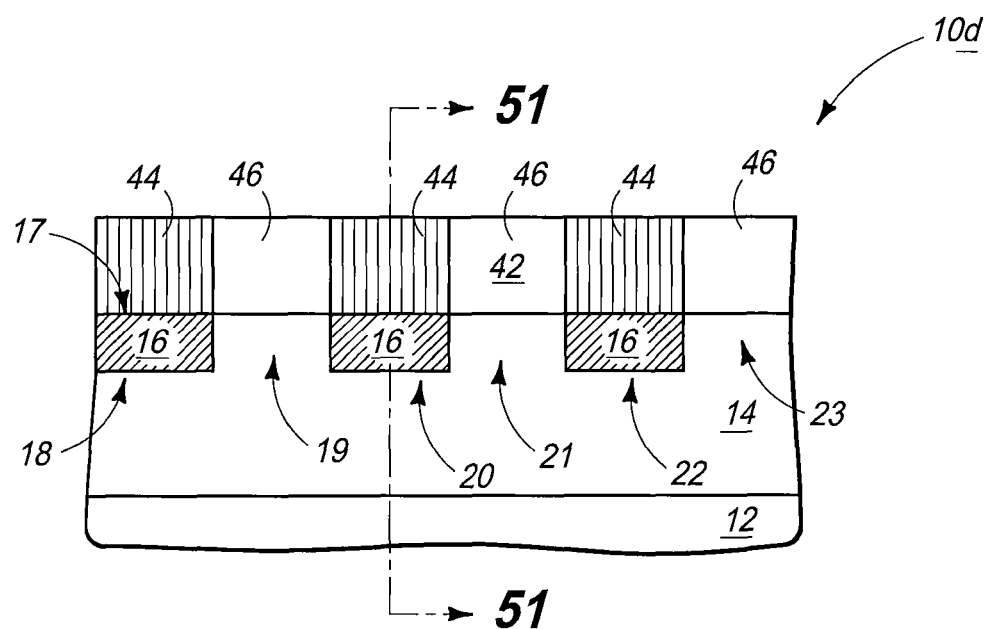

Example embodiments are described with reference to FIGS. 1-52; with FIGS. 1-18 showing a first embodiment, FIGS. 19-24 showing a second embodiment, FIGS. 25-34 showing a third embodiment, FIGS. 35-43 showing a fourth embodiment, and FIGS. 44-52 showing a fifth embodiment.

Figure 2:
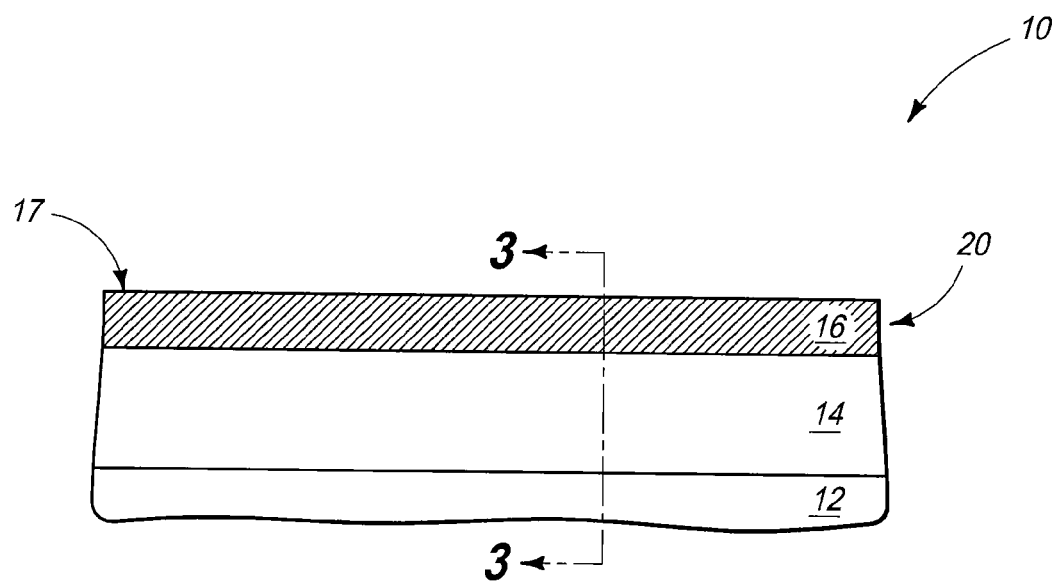
Figure 3:
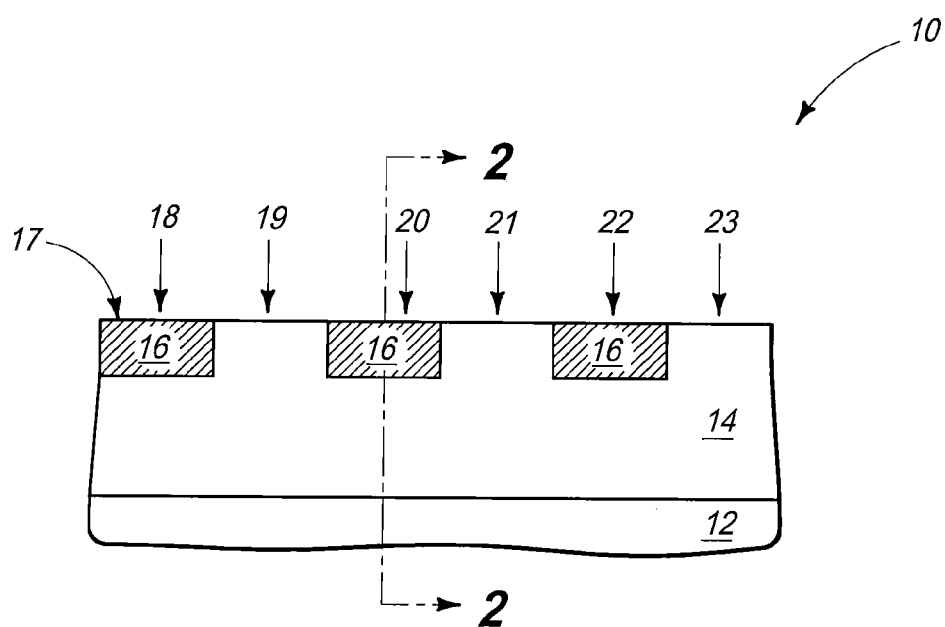

Referring to FIGS. 1-3, a semiconductor construction 10 is illustrated in top view and a pair of cross-sectional side views. The construction 10 includes a base 12 supporting an electrically insulative material 14. A plurality of electrically conductive structures 18, 20 and 22 are formed within insulative material 14. In the shown embodiment, each of the structures 18, 20 and 22 is a line comprising electrically conductive material 16. The electrically conductive lines 18, 20 and 22 alternate with electrically insulative regions 19, 21 and 23 in the top view of FIG. 1, and in some embodiments construction 10 may be considered to comprise a plurality of electrically conductive lines 18, 20 and 22 which are spaced from one another by dielectric regions 19, 21 and 23. The illustrated construction has an upper surface 17.

The electrically conductive lines are shown extending primarily along a first direction parallel to an axis 15. The conductive lines are indicated to extend "primarily" along such axis to indicate that the lines may have regions which are wavy, or which otherwise do not extend exactly along the axis 15, but that the overall linear direction of the lines is along the axis 15. The shown lines 18, 20 and 22 are one example of electrically conductive components that may be formed over substrate 15, and other electrically conductive components may be utilized in other embodiments.

The base 12 may comprise, consist essentially of, or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 12 is shown to be homogenous, the base may comprise numerous structures and components in some embodiments. For instance, base 12 may correspond to a semiconductor substrate containing one or more structures and components associated with integrated circuit fabrication.

The electrically insulative material 14 may comprise any suitable composition or combination of compositions. In some embodiments the electrically insulative material 14 may, for example, comprise, consist essentially of or consist of one or more of silicon dioxide, silicon nitride, borophosphosilicate glass (BPSG), phosphosilicate glass (PSG), fluorosilicate glass (FSG), etc.

The electrically conductive material 16 may comprise any suitable composition or combination of compositions; and in some example embodiments may comprise one or more of various metals (for instance, copper, tungsten, aluminum, platinum, etc.), metal-containing compositions (for instance, metal silicide, metal nitride, etc.), and conductively-doped semiconductor materials (for instance, conductively-doped silicon, conductively doped germanium, etc.).

The configuration of FIGS. 1-3 may be formed by any suitable processing, including, for example, damascene-type processing.

Figure 4:
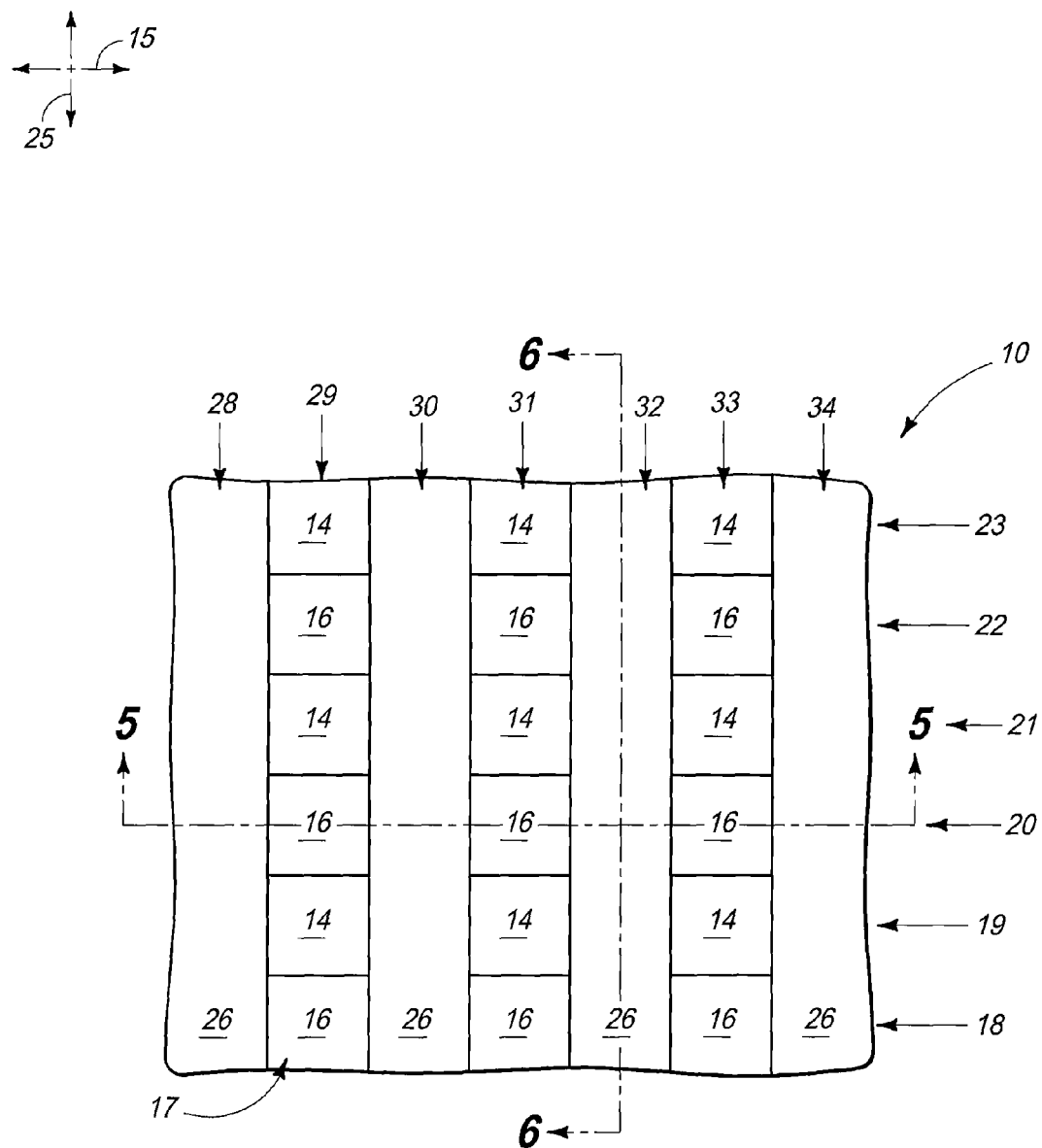
FIGS. 4-6 show a top view and cross-sectional side views of the portion of the semiconductor fragment of FIGS. 1-3 at a process stage subsequent to that of FIGS. 1-3.
Figure 5:
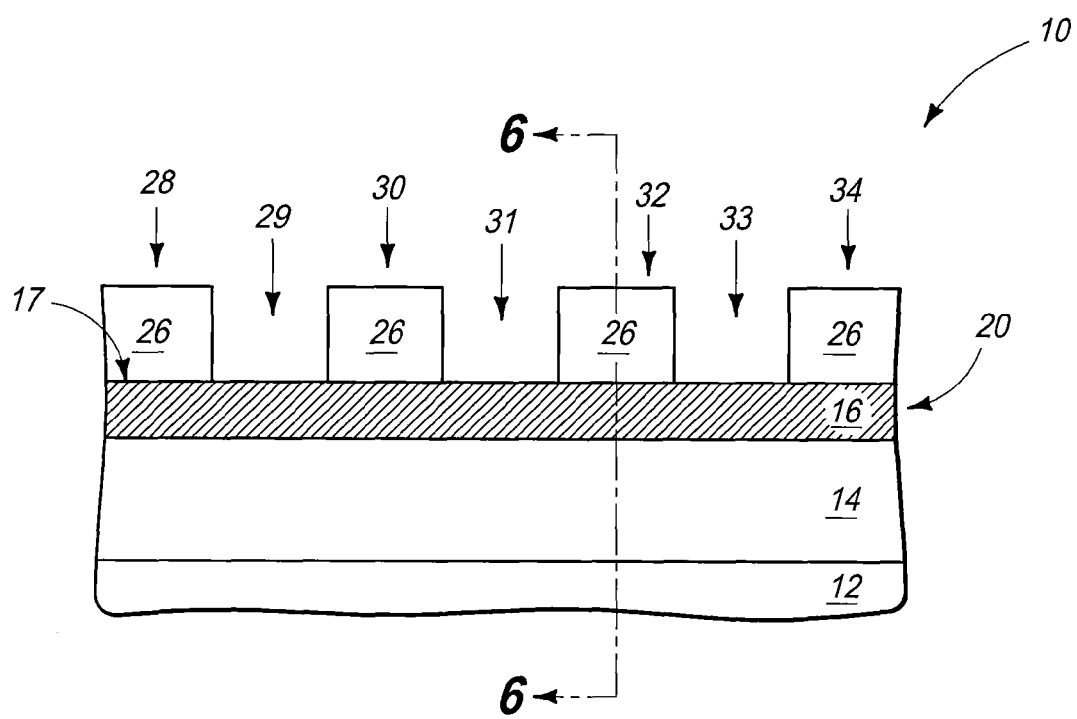
Figure 6:
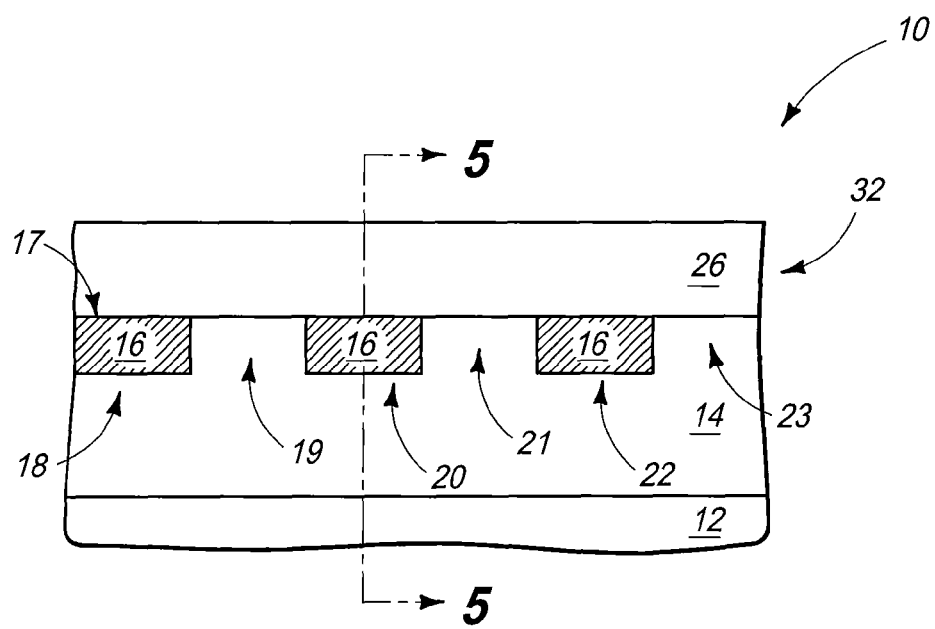

Referring to FIGS. 4-6, a patterned masking material 26 is formed across the upper surface 17 of construction 10. The masking material 26 forms a plurality of lines 28, 30, 32 and 34 that extend primarily along a direction orthogonal to the direction of the electrically conductive lines 18, 20 and 22.

Specifically, the masking material lines 28, 30, 32 and 34 are shown extending along a direction parallel to an axis 25, while the conductive lines 18, 20 and 22 are shown extending along the direction parallel to the axis 15, and the axes 15 and 25 are shown to be orthogonal to one another. In various embodiments the axes 15 and 25 may be at any suitable angle relative to one another, including, for example, 30°, 60°, 90°, etc.

The masking material lines 28, 30, 32 and 34 are spaced from one another by gaps 29, 31 and 33. Upper surfaces of insulative material 14 and conductive material 16 are exposed within such gaps.

Masking material 26 may comprise any suitable composition or combination of compositions. For example, material 26 may be photolithographically-patterned photoresist. As another example, material 26 may be silicon dioxide and the lines 28, 30, 32 and 34 may be formed to sub-lithographic resolution utilizing a pitch-multiplication process. Although the lines 28, 30, 32 and 34 are all shown comprising a same composition (26) as one another, in some embodiments one or more of such lines may comprise a different composition than others. For instance, if a pitch-modification process is utilized to form lines 28, 30, 32 and 34, some of the lines may comprise different compositions than others.

Figure 7:
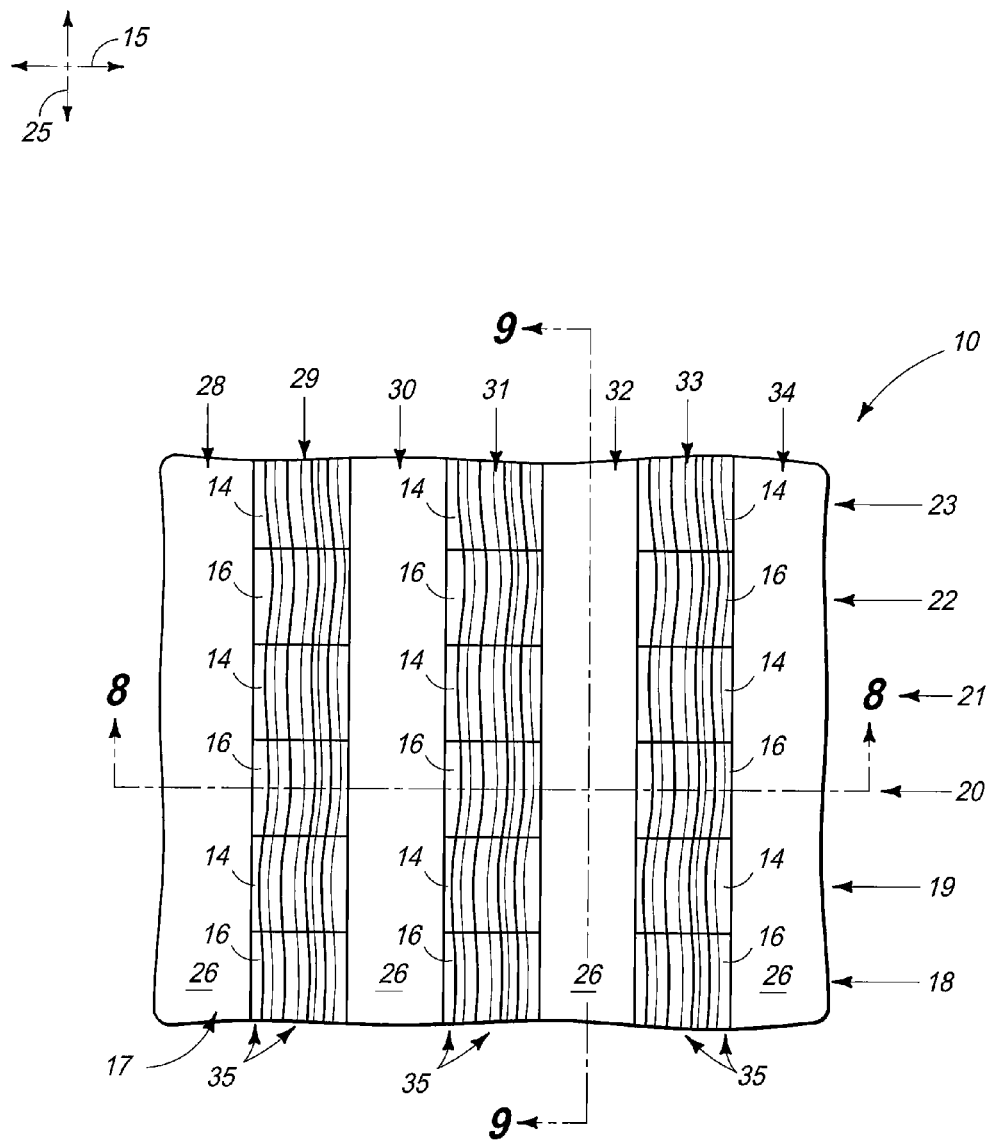
FIGS. 7-9 show a top view and cross-sectional side views of the portion of the semiconductor fragment of FIGS. 1-3 at a process stage subsequent to that of FIGS. 4-6.
Figure 8:
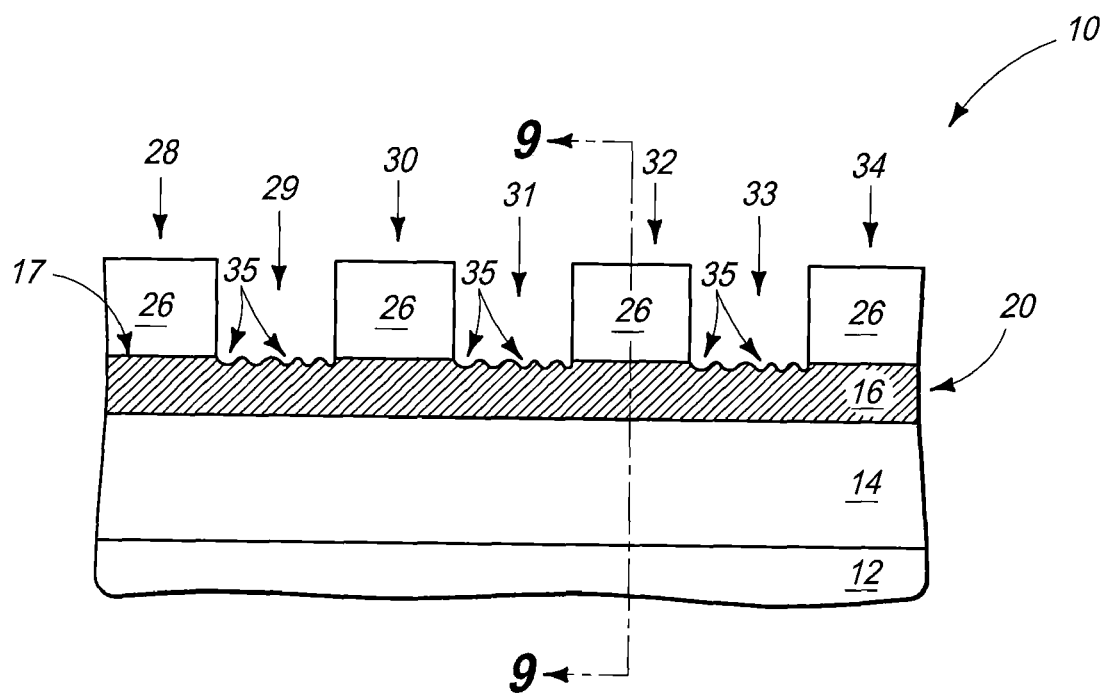
Figure 9:
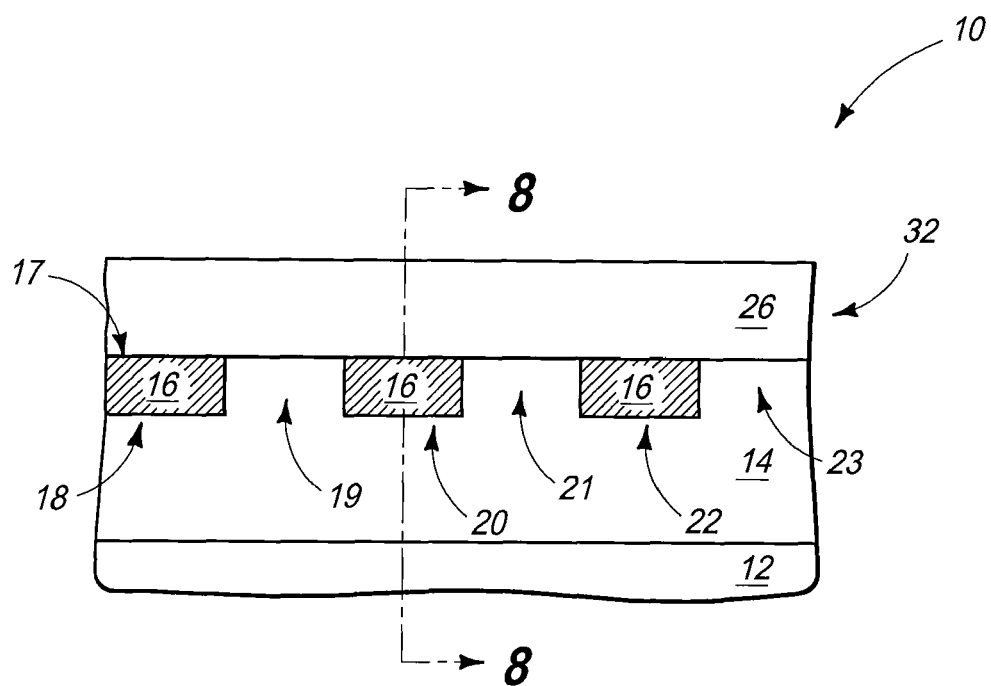

Referring to FIGS. 7-9, the exposed upper surfaces of materials 14 and 16 within gaps 29, 31 and 33 are subjected to conditions which alter the surface properties of such surfaces. The surface property alteration is diagrammatically illustrated as formation of grooves 35 (only some of which are labeled) extending into upper surfaces of materials 14 and 16. The surface property alteration may include any suitable alteration, and in example embodiments may be accomplished by surface roughening, surface texturing, topological grading, chemical modification, etc.

The conditions utilized to form the illustrated grooves 35 may be any suitable conditions, including, for example, utilization of chemical etching and/or physical etching. In some embodiments the purpose of the surface property alteration is to create a different surface configuration along conductive material 16 within the gaps 29, 31 and 33 relative to the surface configuration of the conductive material 16 protected by masking material 26. In such embodiments it can be irrelevant whether the exposed surfaces of insulative material 14 are altered or not. If physical etching is utilized, the etching may be nonselective relative to the insulative surfaces of material 14 and the conductive surfaces of material 16, and thus both types of surfaces may be altered. In contrast, chemical etching may be selective for the conductive surfaces of material 16 relative to the insulative surfaces of material 14, and thus it may be only the surfaces of material 16 which are altered.

In some embodiments the alteration of surface properties along exposed surfaces of conductive material 16 may comprise reactions which form a new chemical species on the exposed surfaces, and thus may or may not form upwardly-extending topographical features in addition to, or alternatively to, the illustrated downwardly-extending topographical features. In some example embodiments the conductive material 16 comprises platinum, and chemical etching and/or reconstruction of the platinum surface may be provided through utilization of platinum-catalyzed oxidation of ammonia at ambient pressure. In such embodiments the degree of surface alteration may be related to the relative duration of exposure of the platinum to the reactants, to the concentration of reactants, etc.

The illustrated formation of grooves (i.e., roughening of a surface) is one method of texturing surfaces of material 16 exposed within gaps 29, 31 and 33. Other methods of texturing such surfaces may be utilized in other embodiments, with another example method being trench formation described below with reference to FIGS. 25-34. For purposes of interpreting this disclosure and the claims that follow, a surface is considered roughened if the deepest topological recessions formed in such surface are less than or equal to 10 Å deep, and is considered to have a trench formed therein if the deepest topological recessions formed into such surface are greater than 10 Å deep.

Figure 10:
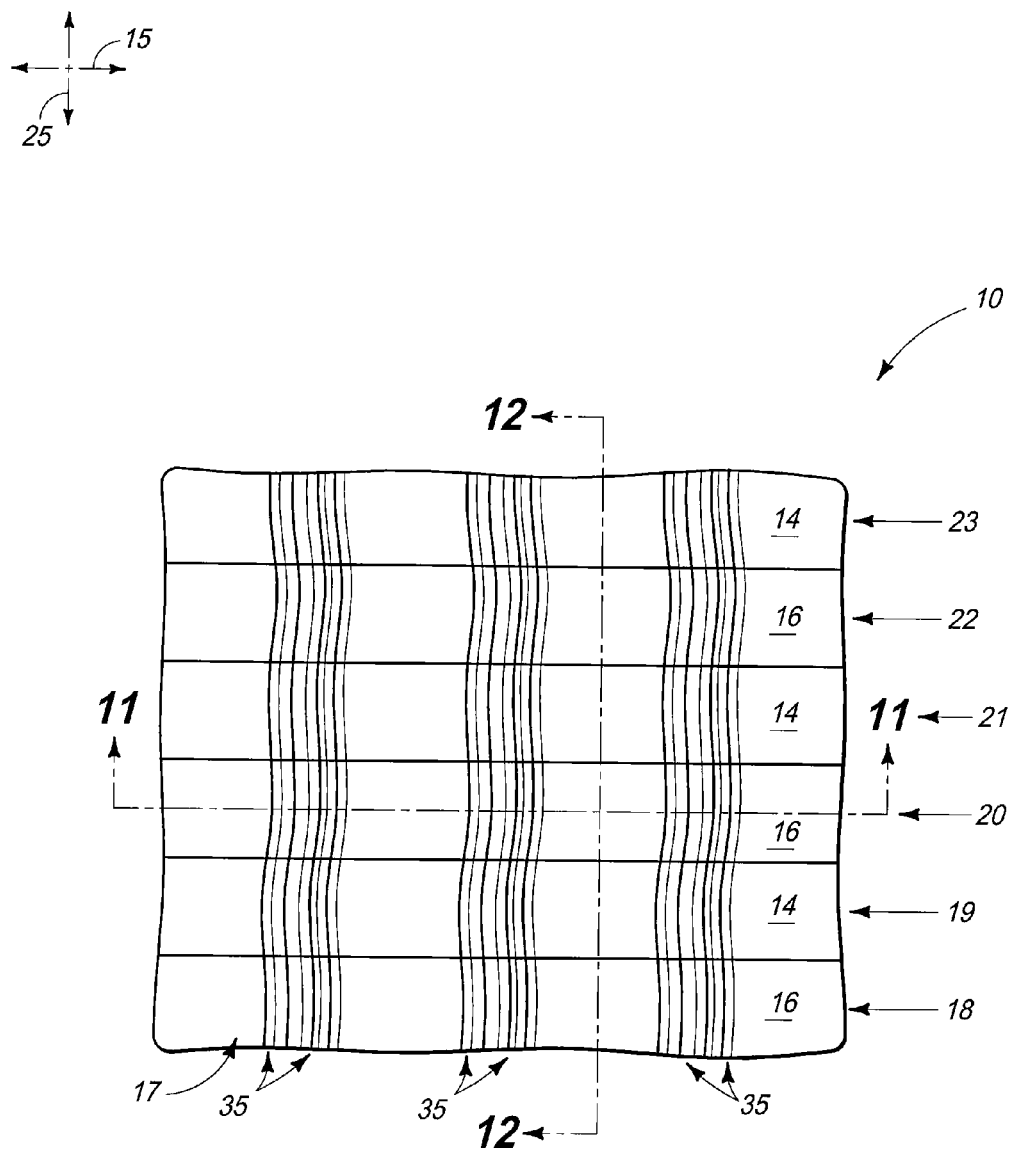
FIGS. 10-12 show a top view and cross-sectional side views of the portion of the semiconductor fragment of FIGS. 1-3 at a process stage subsequent to that of FIGS. 7-9.
Figure 11:
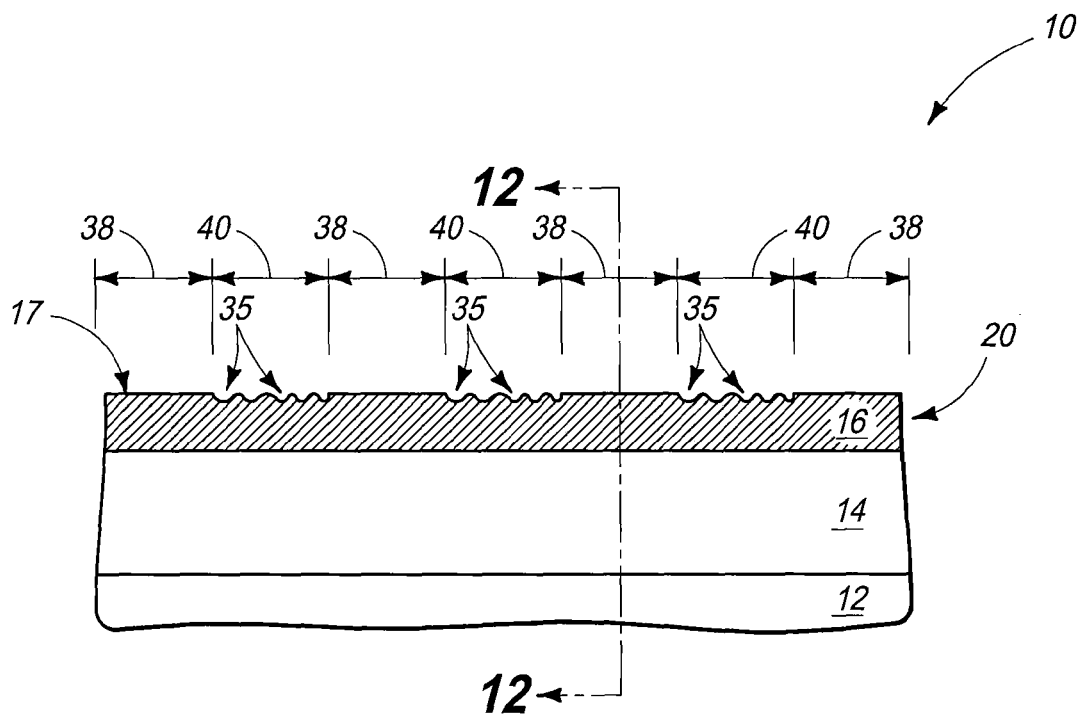
Figure 12:
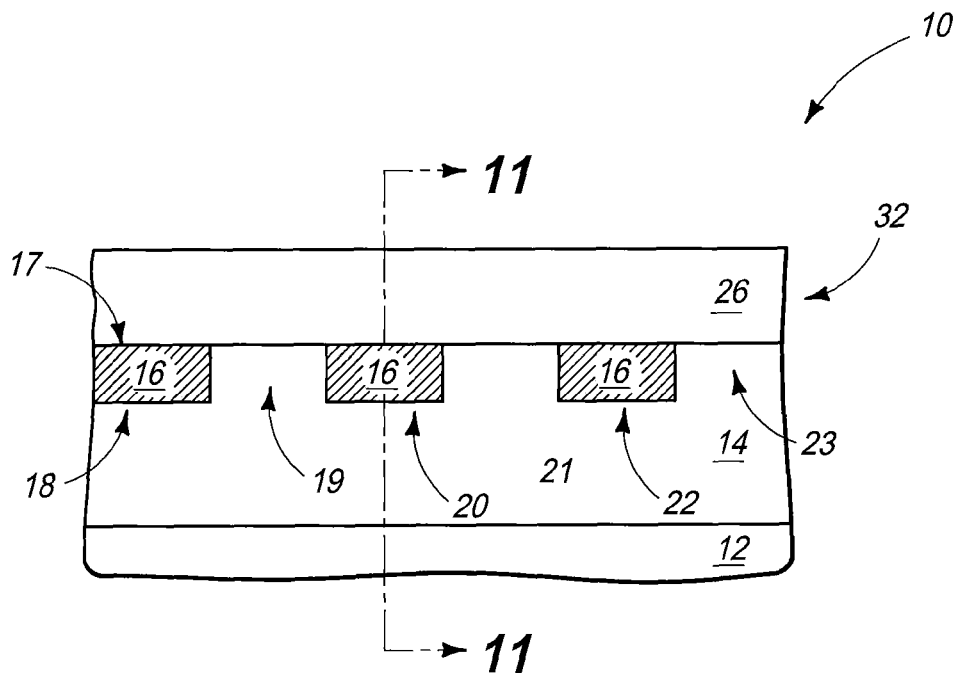

Referring to FIGS. 10-12, masking material 26 (FIGS. 7-9) is removed. If material 26 comprises photoresist, such removal may comprise ashing and/or chemical stripping.

After removal of material 26, each of the conductive lines 18, 20 and 22 has an exposed upper surface comprising two alternating configurations 38 and 40 (shown in FIG. 11 relative to the conductive line 20). The surface configuration 38 is a relatively smooth configuration corresponding to surfaces protected by masking material 26 during the roughening procedure of FIGS. 7-9, and the surface configuration 40 is a relatively rough configuration corresponding to the configuration brought about by the roughening of FIGS. 7-9. The surface configurations 38 and 40 may be referred to as first and second surface configurations, respectively.

Figure 13:
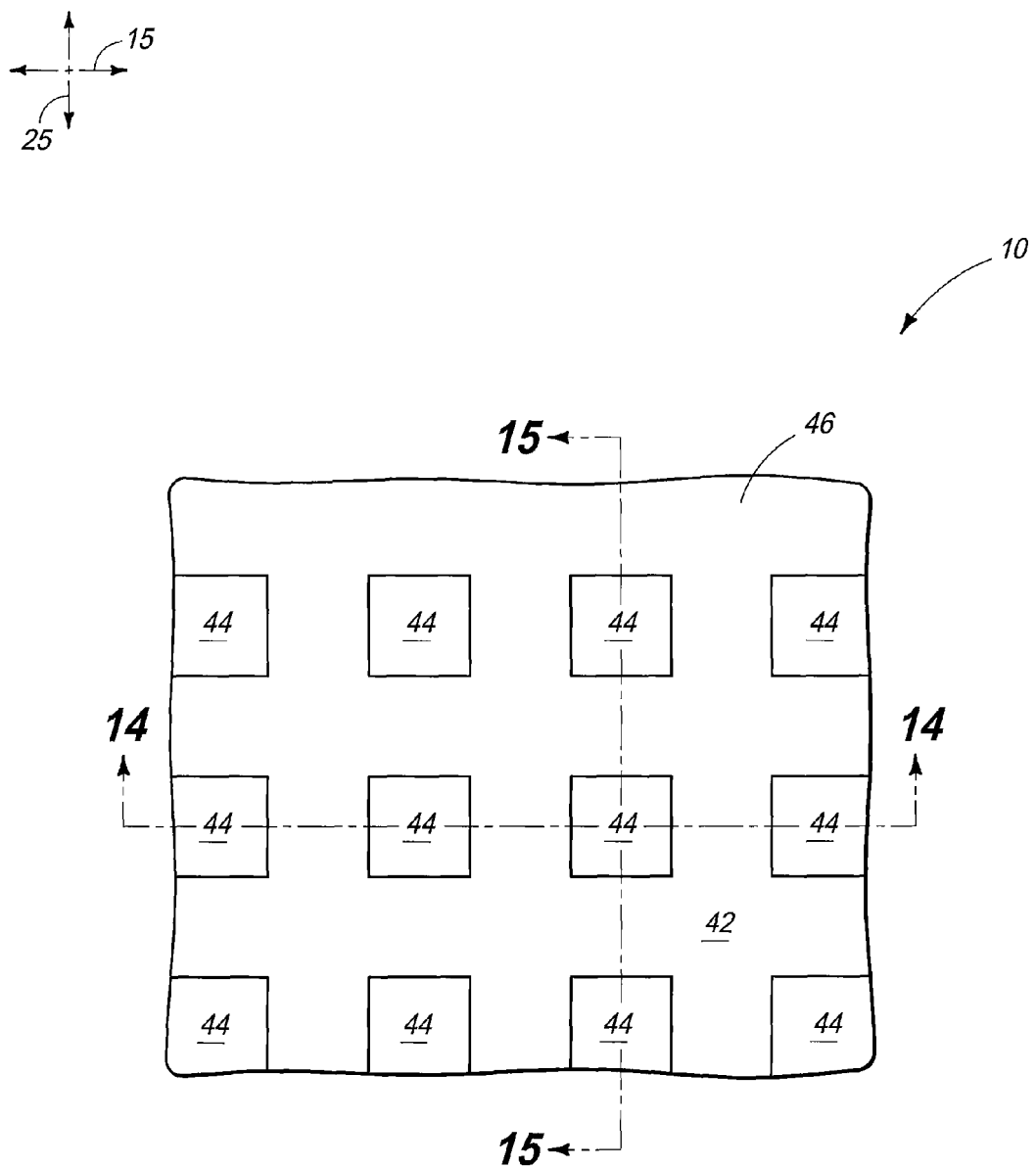
FIGS. 13-15 show a top view and cross-sectional side views of the portion of the semiconductor fragment of FIGS. 1-3 at a process stage subsequent to that of FIGS. 10-12.
Figure 14:
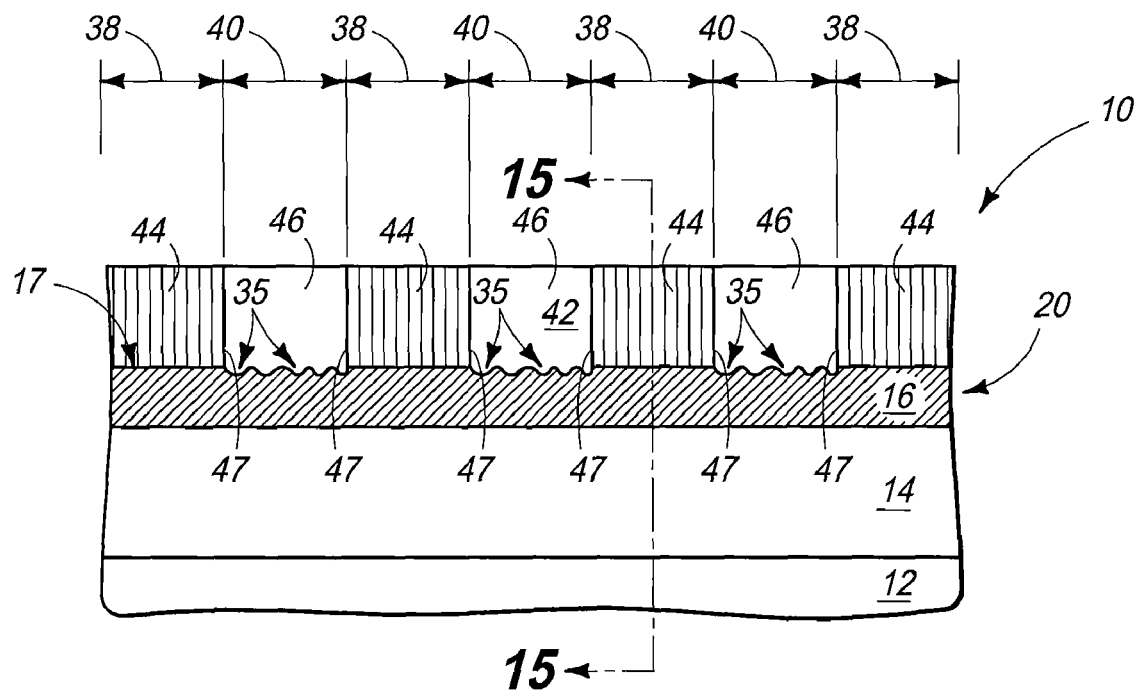
Figure 15:
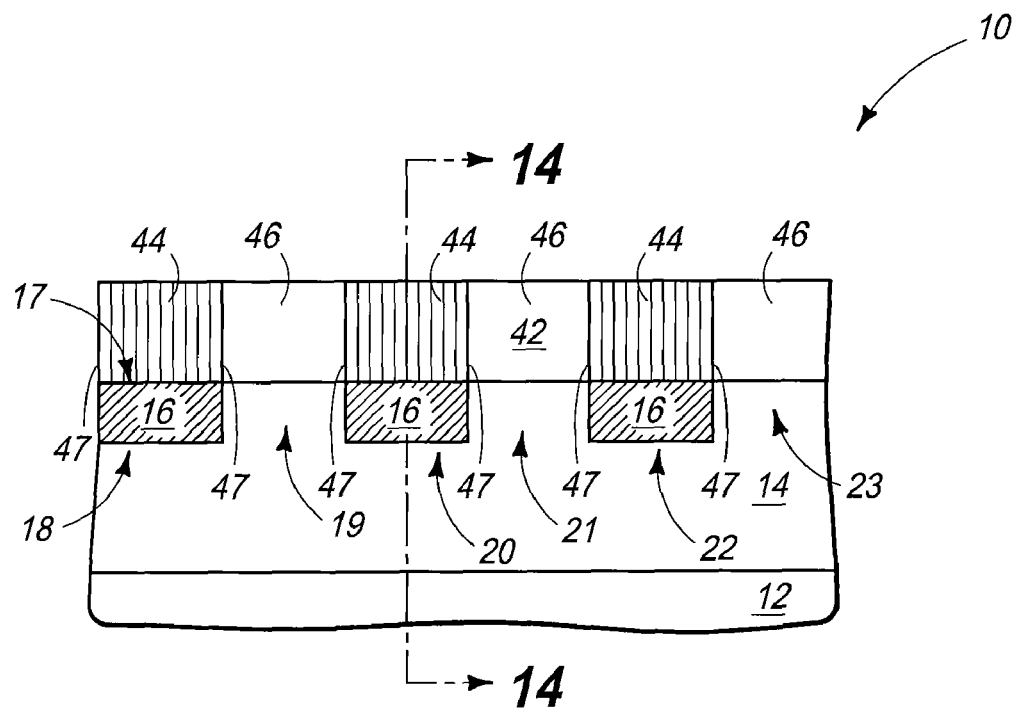

Referring to FIGS. 13-15, material 42 is formed over materials 14 and 16 of construction 10. The material is shown comprising two different domains 44 and 46, with the domain 44 being induced by regions of conductive materials 18, 20 and 22 having the first surface configuration 38; and with domain 46 being induced by regions of conductive materials 18, 20 and 22 having the second surface configuration 40, and also being induced by surfaces of electrically insulative regions 19, 21 and 23. Although the material 42 is shown having two domains induced therein, in other embodiments the material may have more than two domains induced therein. For instance, the domains induced by the surfaces of the electrically insulative regions may be different than the domains induced by the roughened surfaces of the conductive materials.

The domains 44 are shown having columnar features, while the domains 46 are shown having randomized features. In some embodiments material 42 may be a monocrystalline material, and the illustrated columnar features within domains 44 may correspond to a lattice structure within the monocrystalline material. In other embodiments, material 42 may be a polycrystalline material, and the illustrated columnar features within domains 44 may be grain boundary ordered crystallites (i.e., grains). The columnar features of domains 44 illustrate one of many crystallographic patterns that may be formed within domains 44. The domains 44 may be incorporated into electrical components (as discussed below with reference to FIGS. 16-18), and the domains 44 may comprise any features suitable for utilization in such electrical components. In some embodiments it can be desired that the features be columnar features (as shown) in that such can advantageously correspond to a plurality of uniform conductive pathways extending from a first conductive electrode beneath the features to a second conductive electrode above the features. In some embodiments in which domains 44 are suitable for incorporation into electrical components, domains 46 may be suitable for utilization in intervening regions between adjacent electrical components (with the intervening regions being suitable to alleviate or prevent cross-talk between the adjacent electrical components; and in some embodiments being suitable to provide electrical isolation between adjacent electrical components).

An advantage of the shown embodiment is that the intervening regions corresponding to domains 46 are formed and patterned simultaneously with the formation and patterning of circuit structures corresponding to domains 44 simply due to the domains 44 and 46 being induced by surface configurations utilized during the deposition of material 42. Thus, etching and/or other post-deposition patterning procedures of prior art processes may be avoided.

Although domains 44 are illustrated having a crystallographic pattern (specifically, columnar features) in the shown example embodiment, in other embodiments the domains 44 may not be crystalline. However, the domains 44 may differ from domains 46 in a manner which renders domains 44 suitable for incorporation into circuit elements and domains 46 suitable for incorporation into intervening regions between adjacent electrical components (e.g., domains 46 may be suitable for electrical isolation of adjacent circuit elements and/or otherwise suitable for reducing cross-talk between adjacent electrical components). The difference between domains 44 and 46 may include, for example, a difference in one or more of phase, stoichiometry, etc.

In the shown embodiment, boundaries 47 occur where the domains 44 interface with the domains 46. Such boundaries may correspond to seams which act as barriers to electrical migration between domains 44 and 46. If material 42 is monocrystalline, the boundaries 47 may correspond to regions of lattice mismatch between the lattice orientations of domains 44 and the lattice orientations of domains 46. If material 42 is polycrystalline, the boundaries 47 may correspond to regions where grain boundary ordering is disrupted. Such examples are but a couple of the numerous mechanisms by which a boundary may form between domains 44 and 46. Other mechanisms may include increased lattice defect concentration at the interface of domains 44 and 46, amorphization along such interface, etc.

Material 42 may comprise any suitable composition or combination of compositions, and in some embodiments may comprise one or more of various chalcogenides, transition metal oxides, perovskites, borates, crystalline polymers, liquid crystals, molecular monolayers, noble metals, noble element-containing compositions, and single molecules deposited in a crystalline lattice. In some embodiments material 42 may comprise a material suitable for incorporation into a resistive memory device (such as a phase change memory device), and may be referred to as memory cell material. In some embodiments material 42 may comprise a germanium-containing chalcogenide, such as, for example, $Ge_2Sb_2Te_5$. In other embodiments, material 42 may comprise a perovskite, such as, for example, a material comprising Pr, Ca, Mn and O.

Material 42 may be deposited over materials 14 and 16 with conventional methods, and the different surface configurations 38 and 40 can each induce a different type of domain within the material 42 during such deposition. In some embodiments material 42 may be deposited utilizing one or more of physical vapor deposition, chemical vapor deposition, atomic layer deposition, pulsed laser deposition, atomic vapor deposition, molecular beam epitaxy, thermal evaporation, e-beam evaporation, sublimation, etc.

Figure 16:
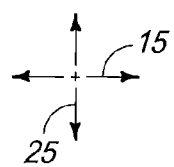
FIGS. 16-18 show a top view and cross-sectional side views of the portion of the semiconductor fragment of FIGS. 1-3 at a process stage subsequent to that of FIGS. 13-15.
Figure 16:
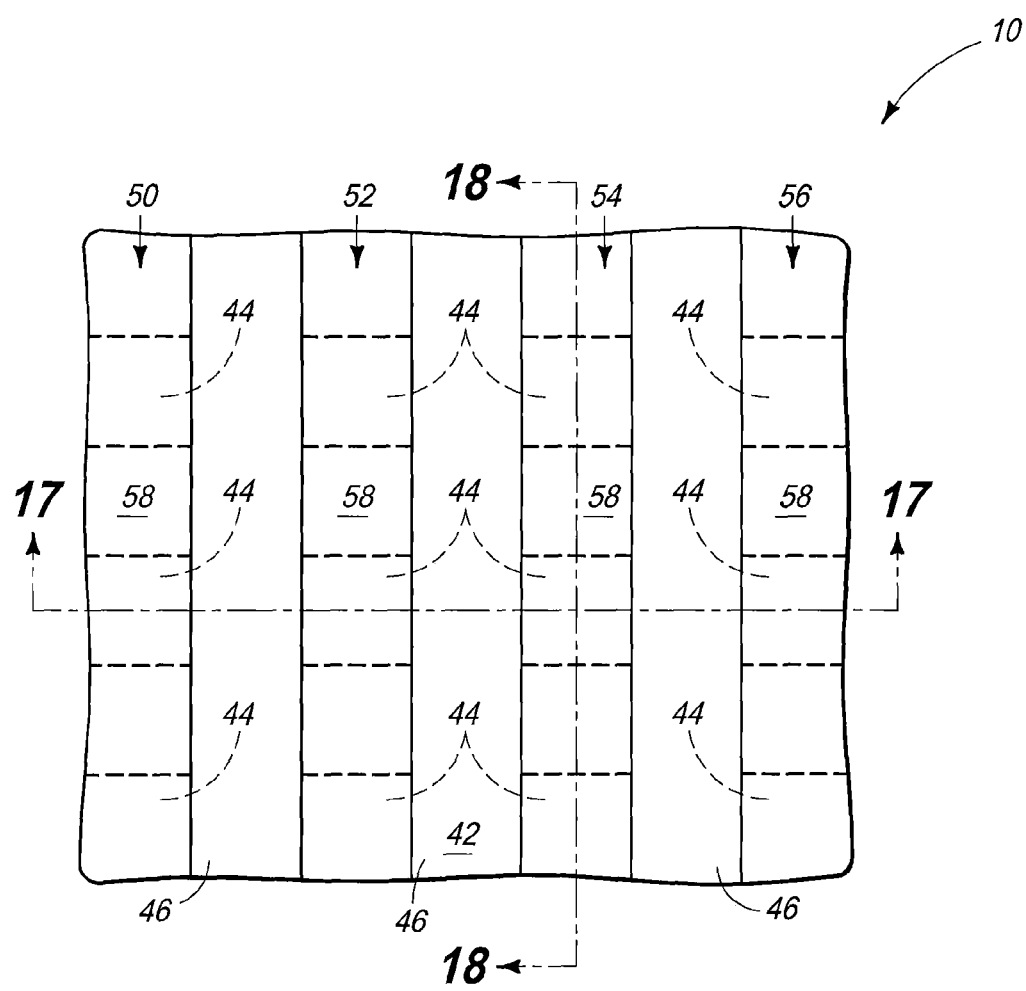
Figure 17:
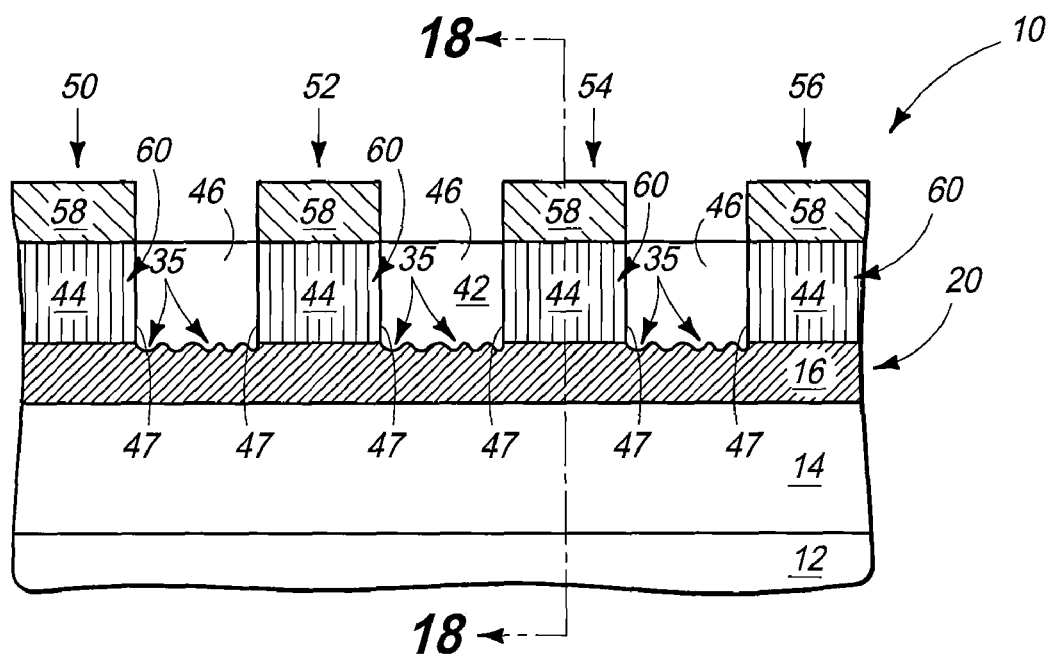
Figure 18:
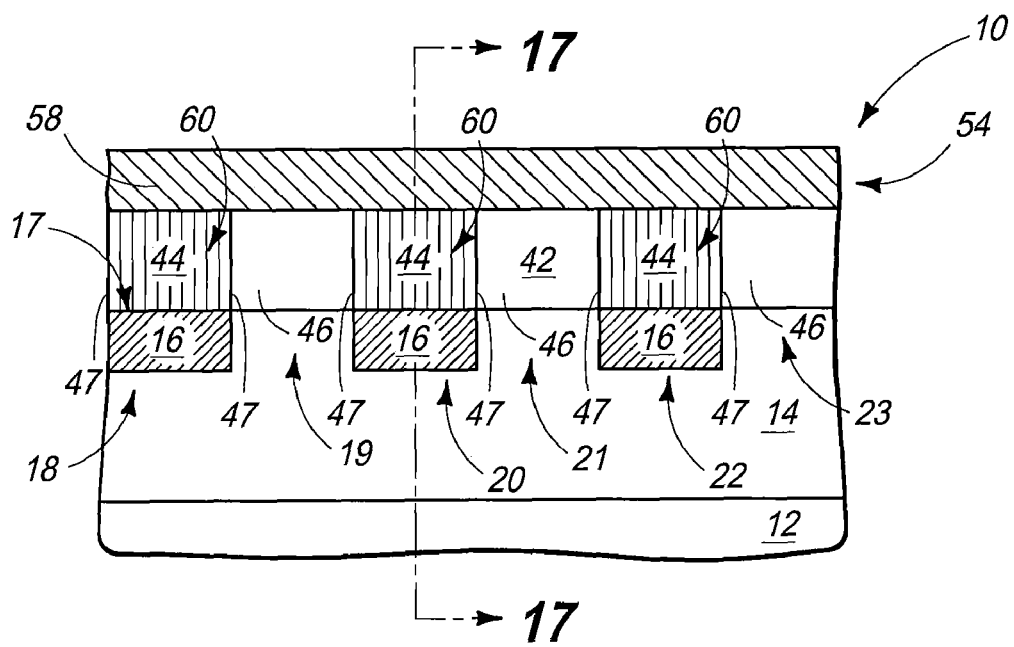

Referring to FIGS. 16-18, electrically conductive structures 50, 52, 54 and 56 are formed across an upper surface of crystalline material 42. The shown structures 50, 52, 54 and 56 are electrically conductive lines 50, 52, 54 and 56. Such lines extend primarily along the direction of axis 25 in the illustrated embodiment, and thus extend primarily orthogonally relative to the conductive lines 18, 20 and 22. The electrically conductive lines 50, 52, 54 and 56 may be referred to as a second series of lines (or alternatively as a second series of conductive structures), while the lines 18, 20 and 22 are referred to as a first series of lines (or alternatively as a first series of conductive structures). The electrically conductive lines 50, 52, 54 and 56 are shown comprising a material 58. Such material may be any suitable electrically conductive material. The material 58 may be the same as the material 16 of lines 18, 20 and 22 in some embodiments, and may be different from material 16 in other embodiments.

In some embodiments the first series of lines (i.e., lines 18, 20 and 22) forms lower electrodes of memory cells, while the second series of lines (i.e., lines 50, 52, 54 and 56) forms upper electrodes of the memory cells. The domains 44 of material 42 are directly between electrically conductive lines of the first series and electrically conductive lines of the second series in the shown embodiment (in some embodiments, not shown, there may be additional materials provided between domains 44 and the electrically conductive lines of the second series). The domains 44 are shown in dashed-line in the top view of FIG. 16 to indicate that such domains are beneath the electrically conductive lines 50, 52, 54 and 56.

The domains 44 are incorporated into electrical components 60 (labeled in FIGS. 17 and 18). In some embodiments such components may be variable resistance memory cells (such as phase change memory cells), electrically conductive interconnects, diodes, etc. In some embodiments other materials besides domains 44 may be between a top conductive line (for instance, line 54) and a bottom conductive line (for instance, line 20) at a location where the lines overlap, and may be incorporated into electrical components with domains 44, or may form other electrical components in addition to the components that incorporate domains 44.

In the shown embodiment the columnar structure of domains 44 extends substantially orthogonally (i.e. substantially normal) to the top surfaces of the bottom conductive lines 18, 20 and 22, and to the bottom surfaces of the top conductive lines 50, 52, 54 and 56, and thus may form electrically conductive conduits between such top and bottom surfaces. In other embodiments a crystalline structure of domains 44 may have another orientation. In yet other embodiments, domains 44 may not have a crystalline structure.

The domains 46 of material 42 are electrically decoupled from domains 44 along the boundaries 47, and thus the domains 46 can provide intervening regions which reduce cross-talk and/or provide electrical isolation between adjacent electrical components (for instance, memory cells 60 in some embodiments).

The processing of FIGS. 1-18 advantageously patterns material 42 into the domains 44 suitable for incorporation into electrical components, and into the intervening regions of domains 46, utilizing a single masking step (specifically, the masking shown in FIGS. 4-6); and without need for subsequent etching or polishing of material 42.

The embodiment of FIGS. 1-18 shows the intervening regions of domains 46 remaining between adjacent electrical components. In other embodiments it may be desired to remove such intervening regions and replace them with dielectric material. An example embodiment in which the intervening regions of domains 46 are removed is described with reference to FIGS. 19-24.

Figure 19:
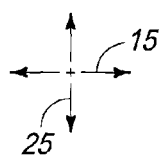
FIGS. 19-21 show a top view and cross-sectional side views of a portion of a semiconductor fragment at a process stage of another example embodiment method. The process stage of FIGS. 19-21 may follow that of FIGS. 13-15.
Figure 19:
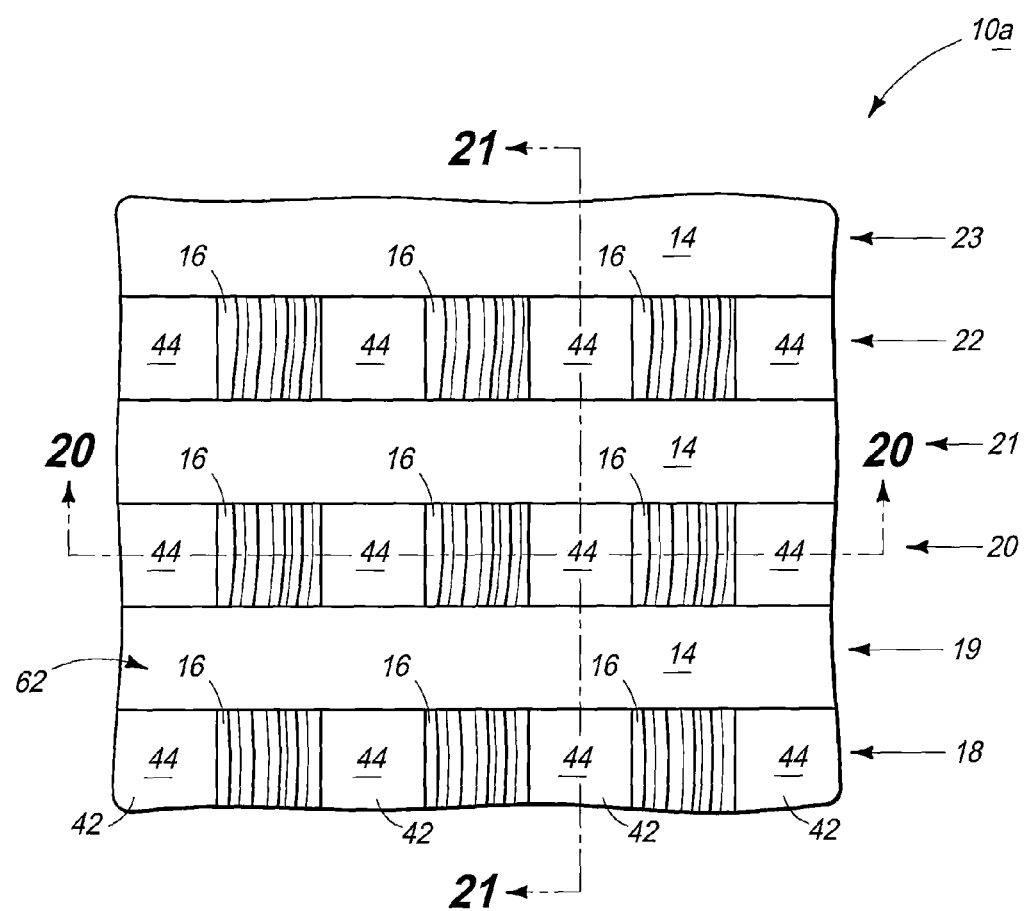
Figure 20:
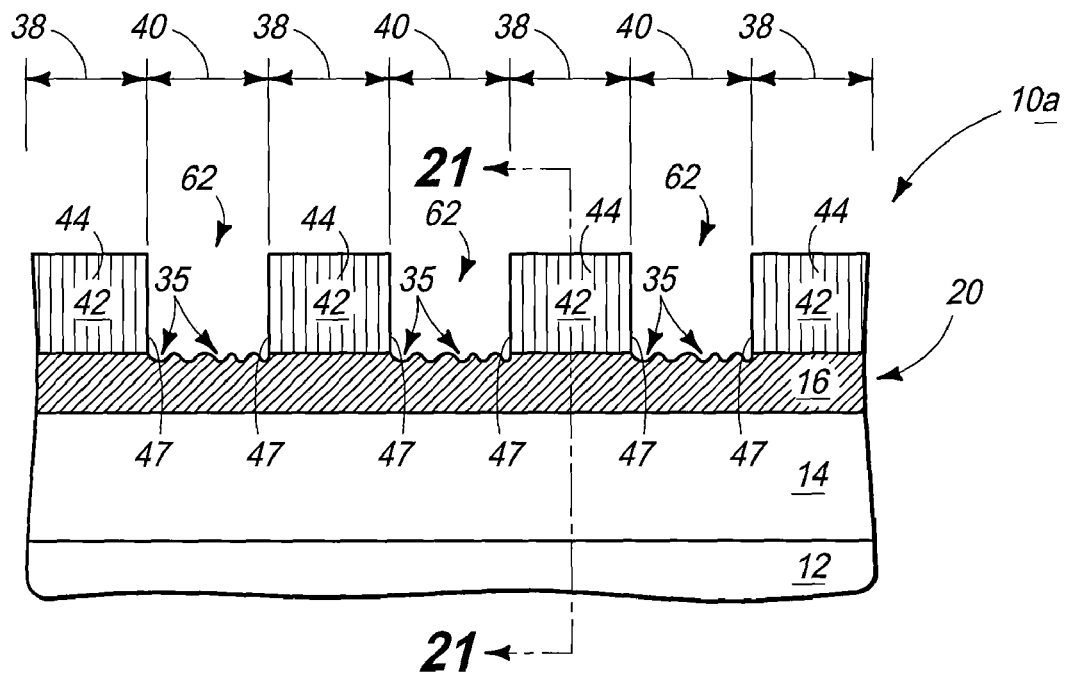
Figure 21:
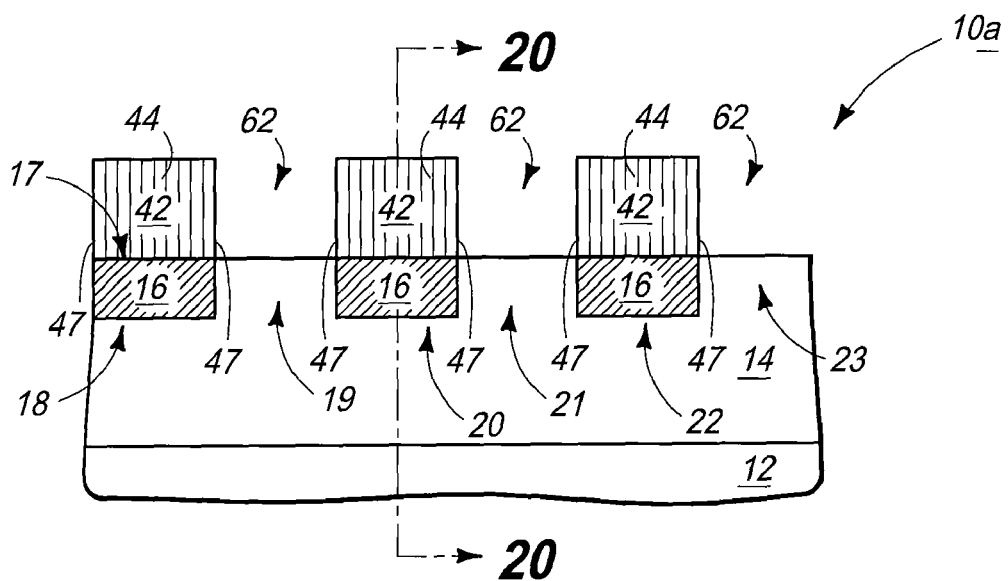

Referring to FIGS. 19-21, a construction 10a is shown at a processing stage subsequent to that of FIGS. 13-15. Specifically, the domains 46 (FIGS. 13-15) of material 42 have been removed selectively relative to the domains 44. Such leaves gaps 62 between regions of the first domains. The portions of electrically conductive material 16 having the second surface configurations 40 are exposed within the gaps 62, and the electrically insulative material 14 is also exposed within such gaps.

The domains 46 (FIGS. 13-15) may be selectively removed relative to domains 44 utilizing any suitable processing. In some embodiments domains 46 will have a more disordered structure than domains 44. For instance, domains 46 may have a more disordered lattice structure than domains 44 if the domains 44 and 46 are crystalline, or domains 46 may have a more disordered texture or grain boundary orientation than domains 44 if the domains 44 and 46 are polycrystalline. The relatively disordered structure of domains 46 can render such domains to be more susceptible to a chemical etch than the domains 44 in that the chemical etching may more readily consume or react with the disordered structure than the ordered structure. Thus, domains 46 may be selectively removed relative to domains 44 with conventional chemical etchants.

Figure 22:
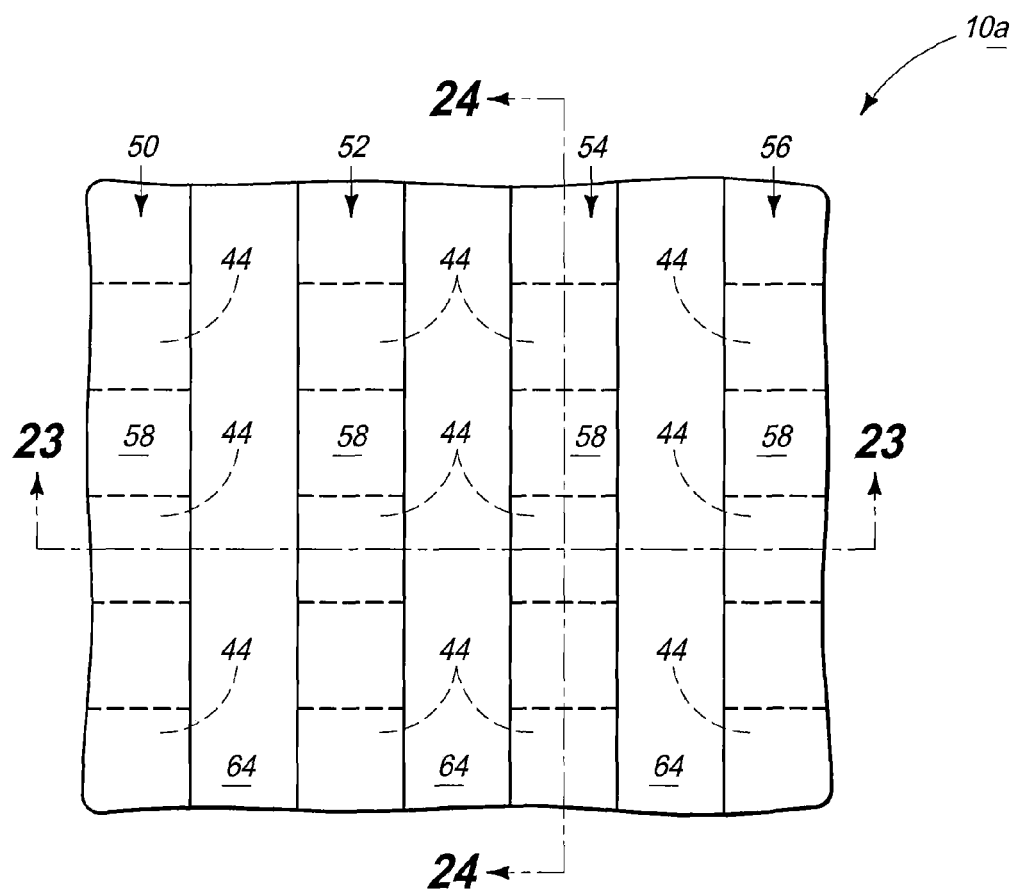
FIGS. 22-24 show a top view and cross-sectional side views of the portion of the semiconductor fragment of FIGS. 19-21 at a process stage subsequent to that of FIGS. 19-21.
Figure 23:
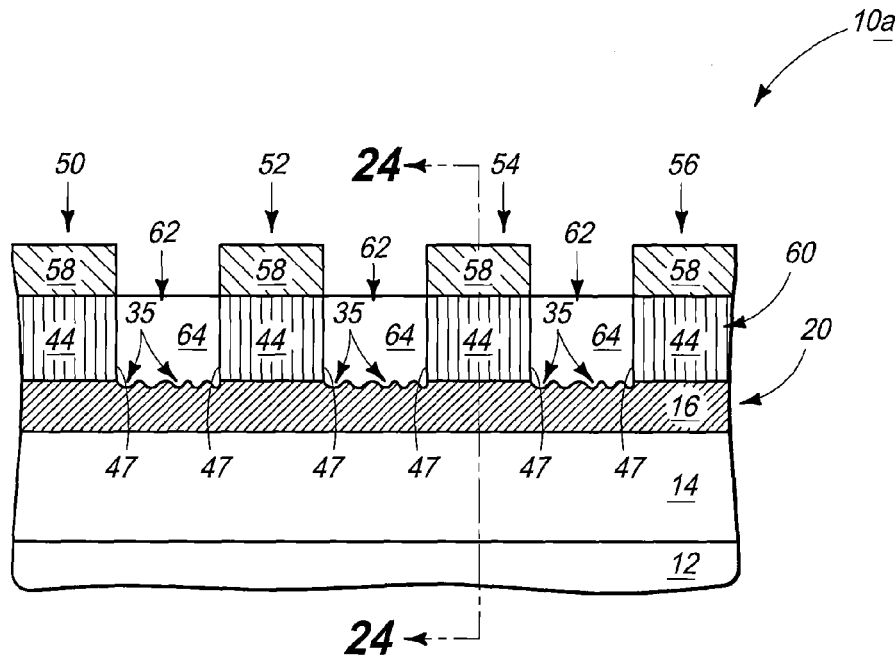
Figure 24:
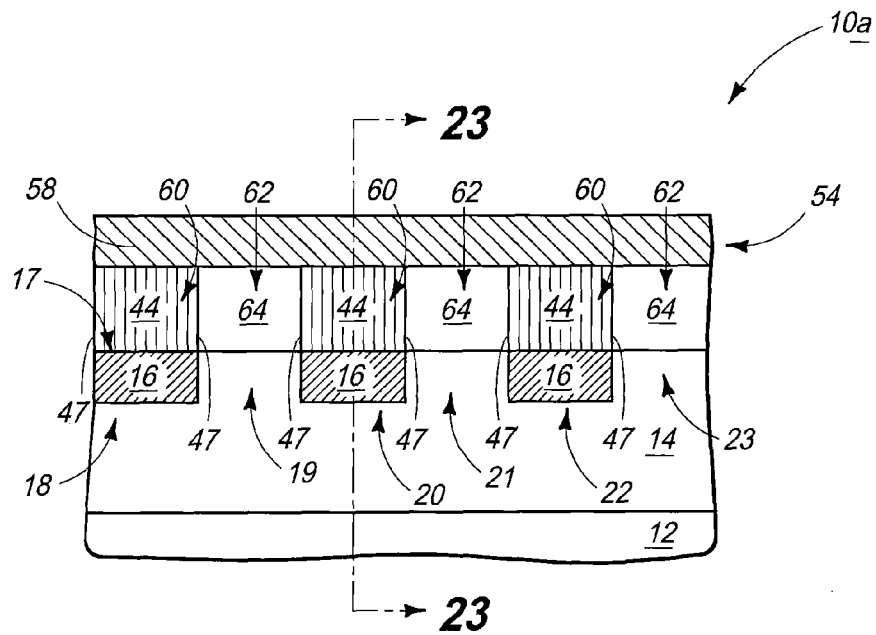

Referring to FIGS. 22-24, electrically insulative material 64 is provided within gaps 62, and subsequently electrically conductive lines 50, 52, 54 and 56 (analogous to the lines discussed above with reference to FIGS. 16-18) are formed across the insulative material 64 and the domains 44. The domains 44 are thus incorporated into electrical components 60 analogous to the electrical components discussed above with reference to FIGS. 16-18. A difference between the embodiment of FIGS. 22-24 and that of FIGS. 16-18 is that the electrical components 60 of FIGS. 22-24 are spaced from one another by intervening regions comprising electrically insulative material 64, while the electrical components 60 of FIGS. 16-18 are spaced from one another by intervening regions corresponding to the second domains 46 of material 42.

The electrically insulative material 64 of FIGS. 22-24 may comprise any suitable composition or combination of compositions; and in some embodiments may comprise, consist essentially of, or consist of one or more of silicon dioxide, silicon nitride, BPSG, PSG and FSG. In the shown embodiment a planarized surface extends across upper surfaces of the electrically insulative material 64 and the domains 44. Such planarized surface may be formed by chemical-mechanical polishing (CMP) following the deposition of insulative material 64.

As discussed above with reference to FIGS. 7-9, the texturing of various regions of conductive material 16 may be accomplished with the roughening described with reference to FIGS. 7-9, or may comprise formation of trenches. FIGS. 25-34 illustrate an example embodiment in which trenches are formed.

Figure 25:
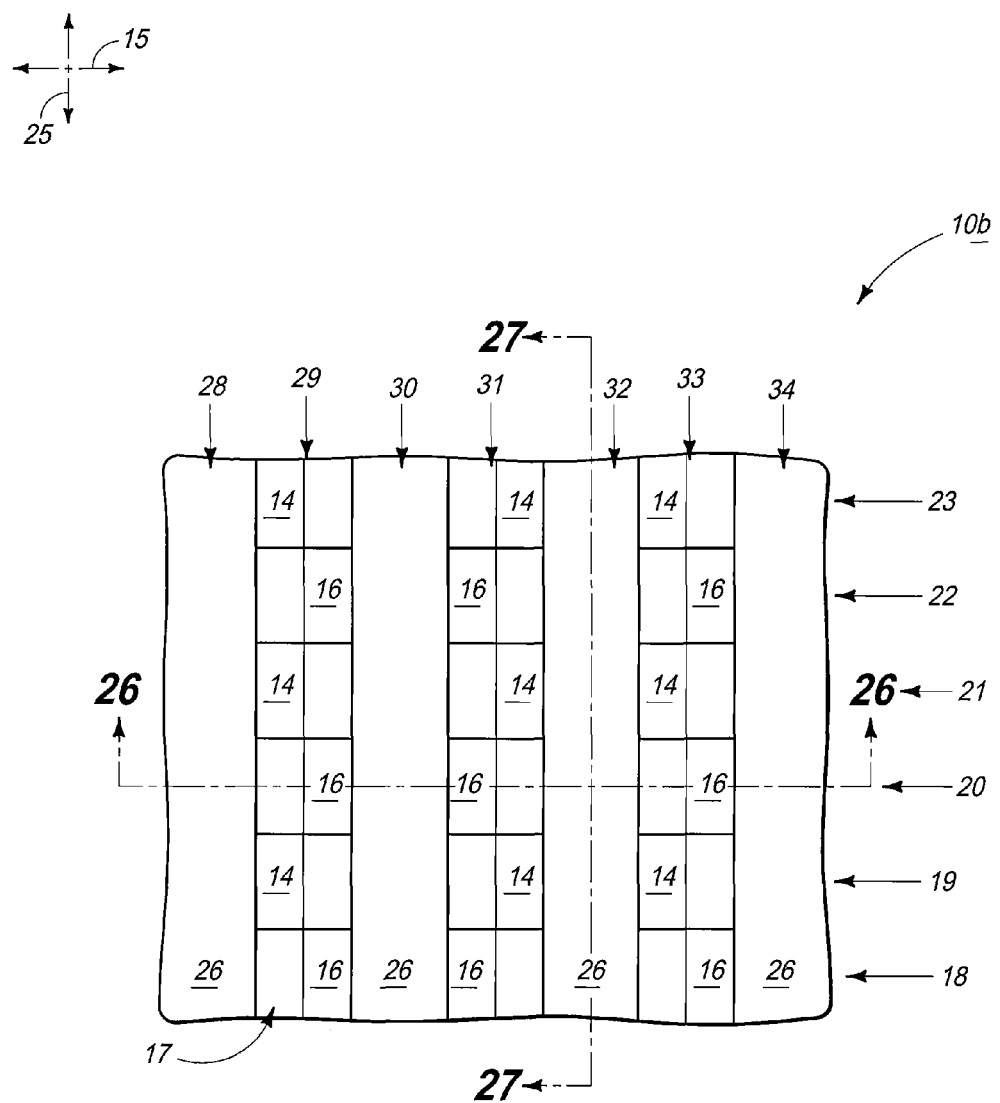
FIGS. 25-27 show a top view and cross-sectional side views of a portion of a semiconductor fragment at a process stage of another example embodiment method. The process stage of FIGS. 25-27 may follow that of FIGS. 4-6.
Figure 26:
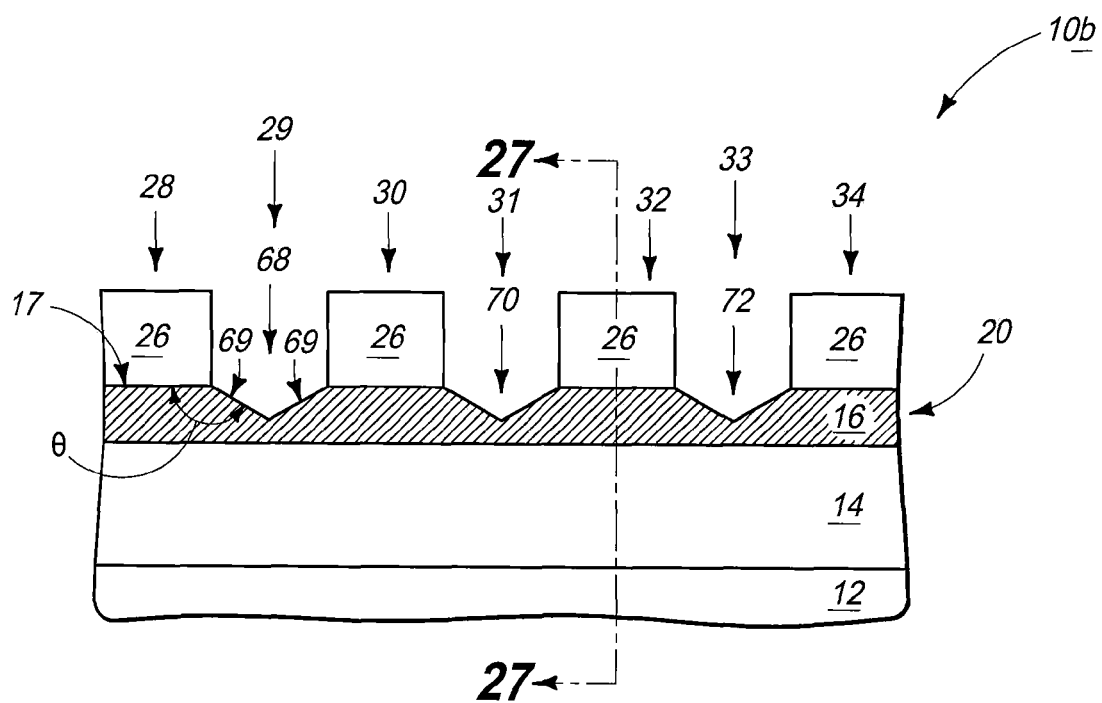
Figure 27:
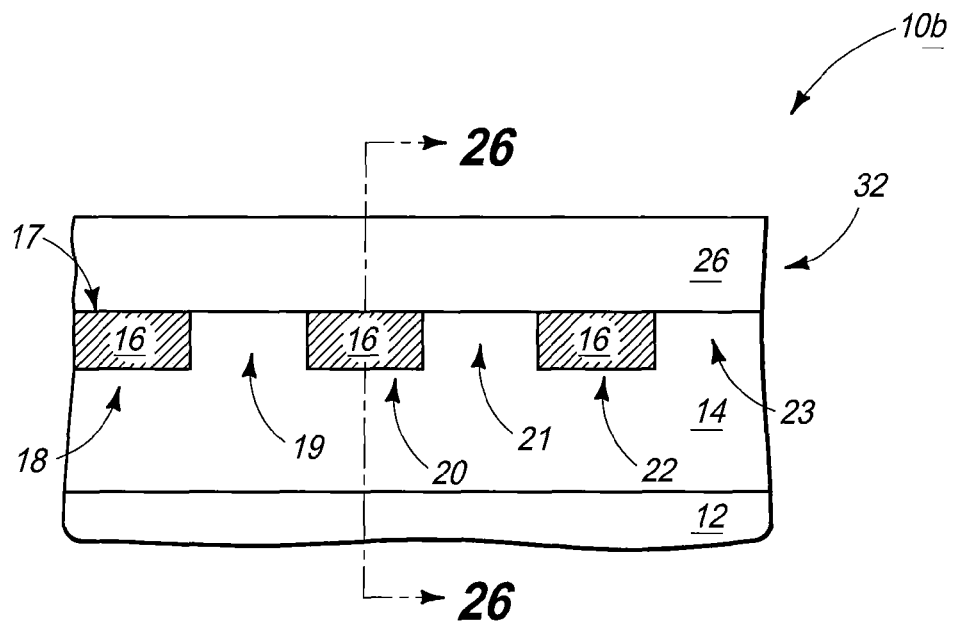

Referring to FIGS. 25-27, a construction 10b is shown at a processing stage subsequent to that of FIGS. 4-6. The construction includes the lines 28, 30, 32 and 34 of patterned masking material 26, with such lines being spaced from one another by the gaps 29, 31 and 33.

The materials 14 and 16 are etched within such gaps to form trenches 68, 70 and 72 (shown in FIG. 26).

FIG. 26 shows that an example conductive line (specifically, line 20) has the initial upper surface 17, and that the trenches have sidewalls 69 (shown for trench 68) that extend at an angle θ relative to surface 17. In some embodiments angle θ may be within a range of from about 90° to about 175°.

The etching utilized to form trenches 29, 31 and 33 may be nonselective relative to materials 14 and 16 so that the trenches extend into both of materials 14 and 16, or may be selective for material 16 relative to material 14 so that the trenches are primarily within material 16. The etching may involve one or both of physical and chemical processes; with example etch processes including sputtering, reactive ion etching and wet chemical etching. In some example embodiments conductive material 16 may comprise platinum, and the etching may utilize argon ion etching.

Figure 28:
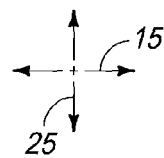
FIGS. 28-30 show a top view and cross-sectional side views of the portion of the semiconductor fragment of FIGS. 25-27 at a process stage subsequent to that of FIGS. 25-27.
Figure 28:
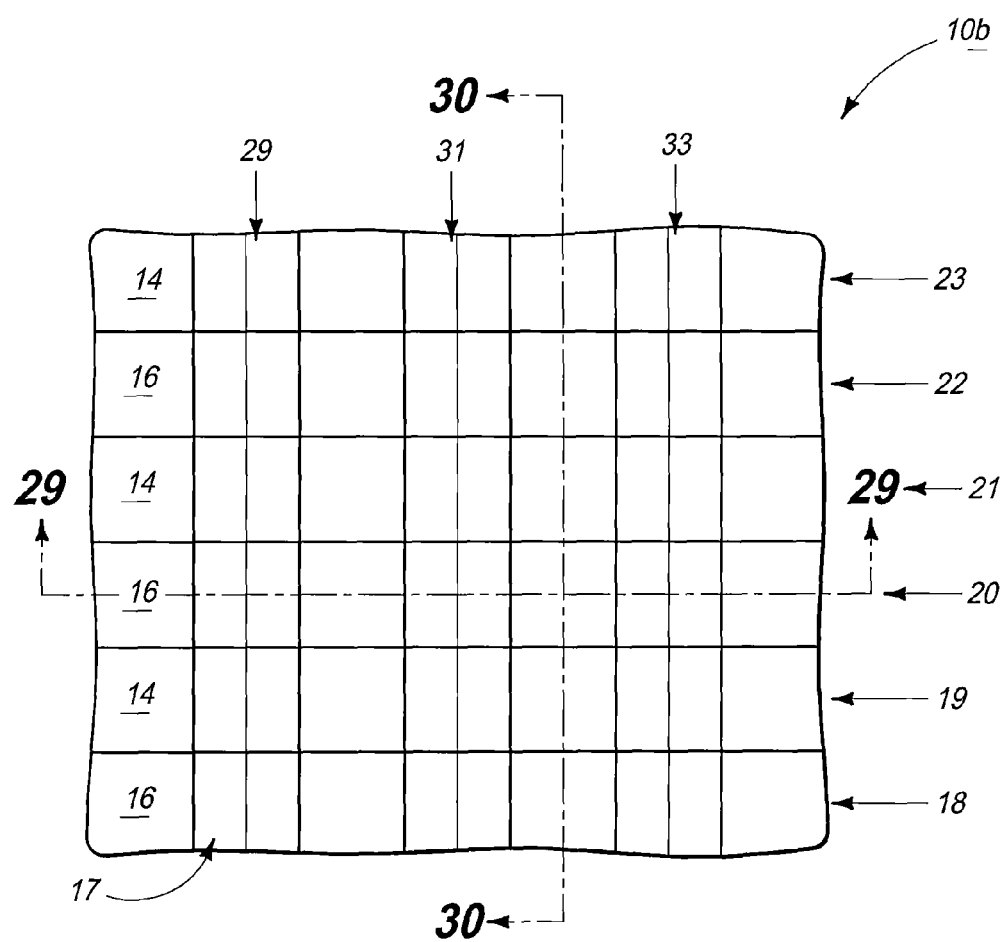
Figure 29:
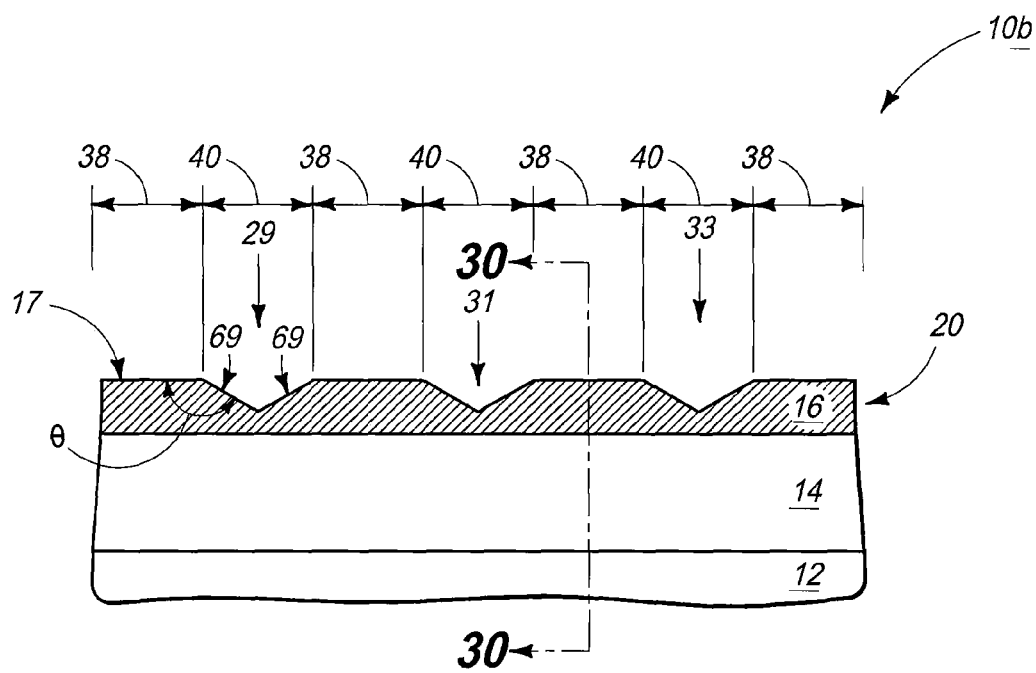
Figure 30:
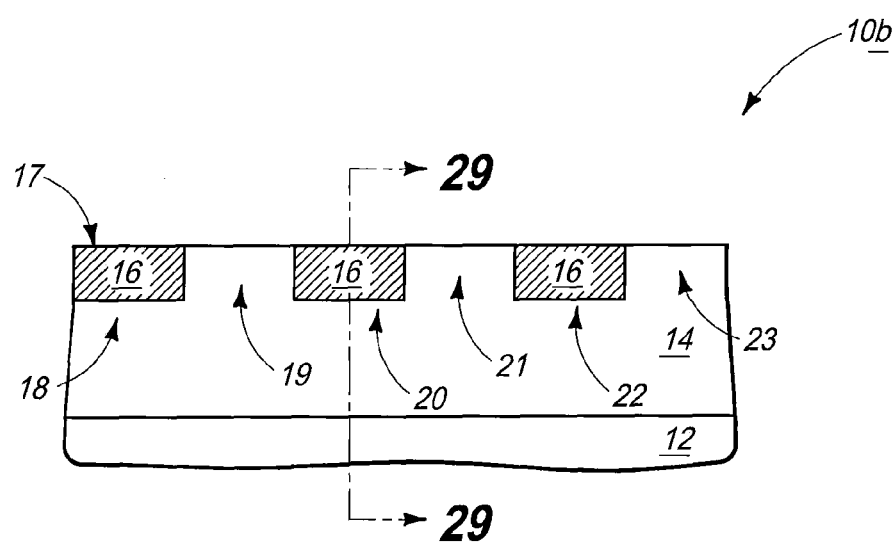

Referring to FIGS. 28-30, masking material 26 (FIGS. 25-27) is removed. After the removal of material 26, each of the conductive lines 18, 20 and 22 has an exposed upper surface comprising the two alternating configurations 38 and 40 (shown in FIG. 29 relative to the conductive line 20). The surface configuration 38 corresponds to the flat configuration of initial surface 17, and the surface configuration 40 corresponds to the angled sidewalls of the trenches 29, 31 and 33.

Figure 31:
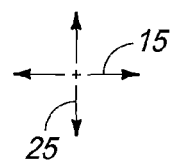
FIGS. 31-33 show a top view and cross-sectional side views of the portion of the semiconductor fragment of FIGS. 25-27 at a process stage subsequent to that of FIGS. 28-30.
Figure 31:
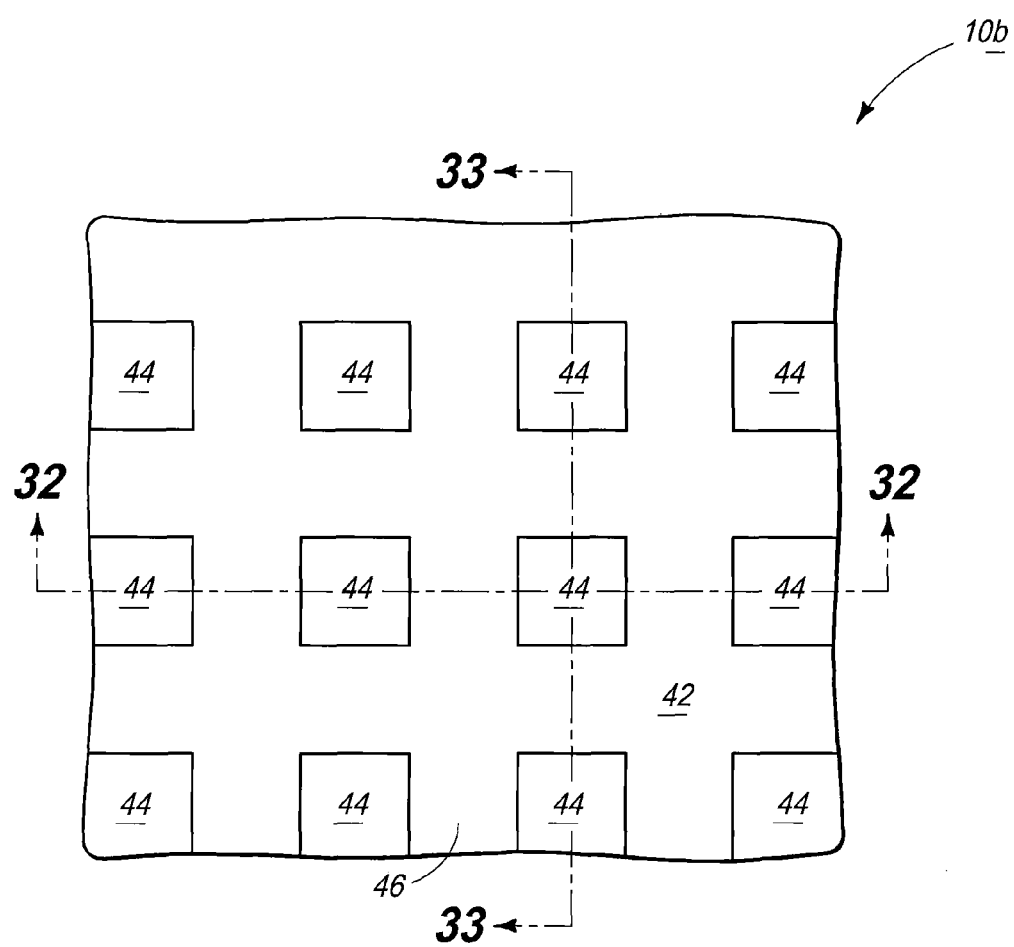
Figure 32:
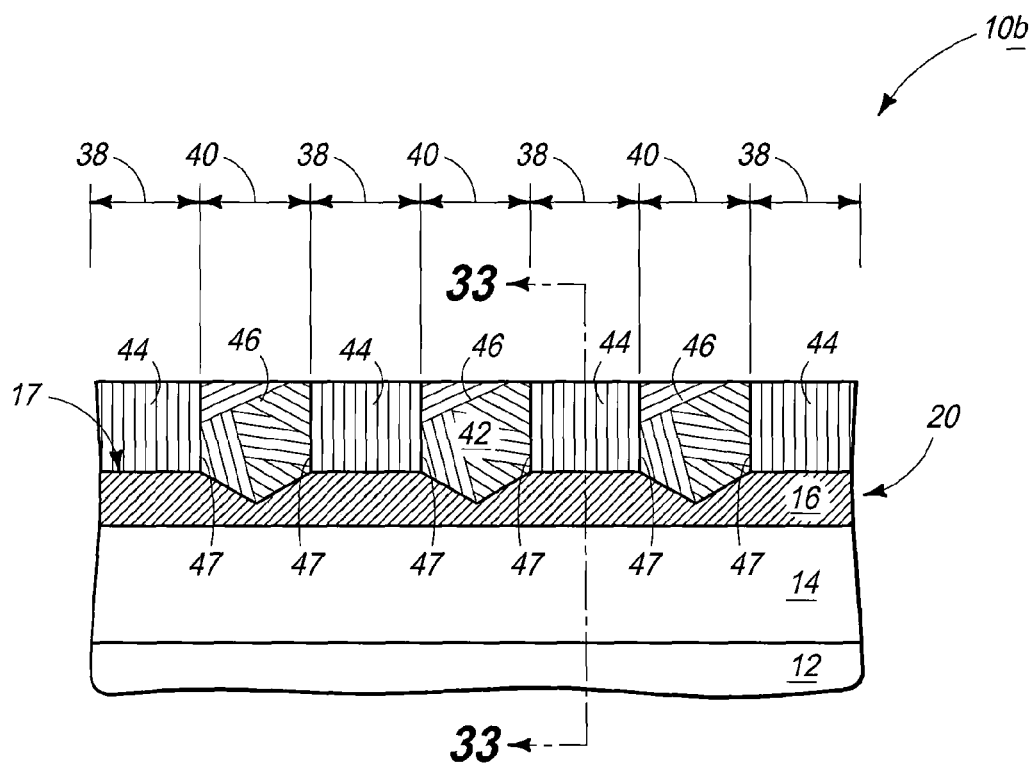
Figure 33:
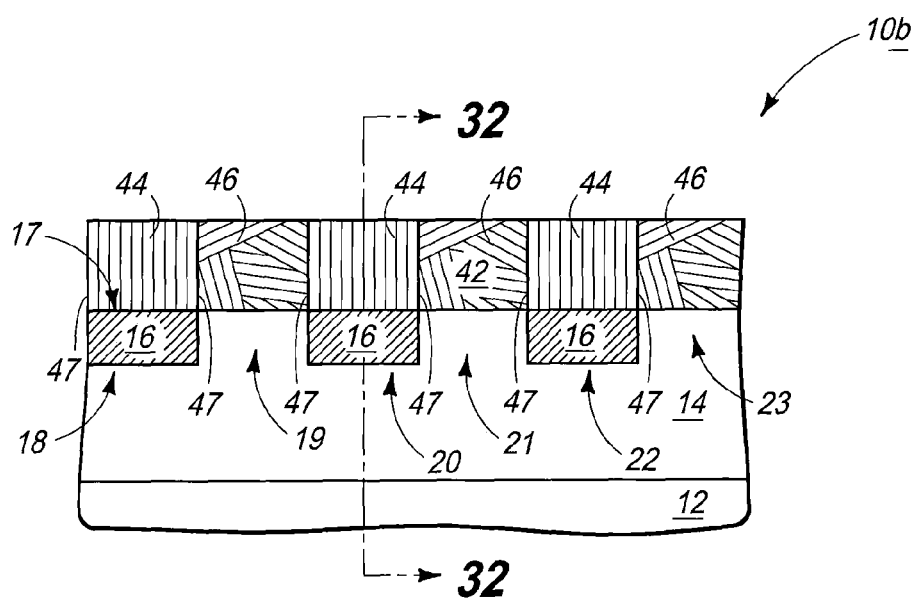

Referring to FIGS. 31-33, material 42 is formed over materials 14 and 16. The material is shown comprising the two different domains 44 and 46, with the domain 44 being induced by regions of conductive materials 18, 20 and 22 having the first surface configuration 38; and with domain 46 being induced by regions of conductive materials 18, and 22 having the second surface configuration 40, and also being induced by surfaces of electrically insulative regions 19, 21 and 23.

The domains 44 are shown having columnar features, while the domains 46 are shown having randomized features. In the shown embodiment the material 42 is polycrystalline, and individual crystallites (i.e., grains) are shown within the domains 44 and 46. In other embodiments material 42 may be a monocrystalline material, and the illustrated columnar features within domains 44 may correspond to a lattice structure within the monocrystalline material. In embodiments in which material 42 is monocrystalline, the domains 46 may have relatively high disorder as compared to domains 44 due to domains 46 having a higher lattice defect concentration than domains 44.

In the shown embodiment boundaries 47 between the domains 44 and the domains 46 correspond to regions where grain boundary ordering is disrupted.

Figure 34:
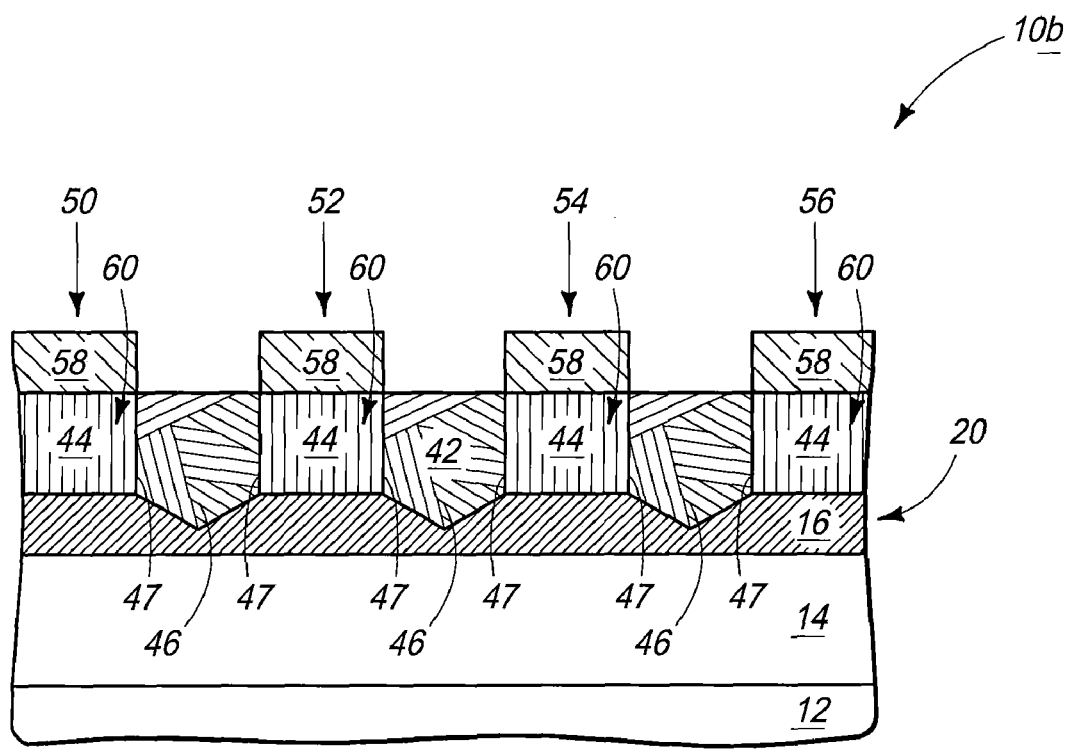
FIG. 34 is a view of the portion of the semiconductor fragment of FIGS. 25-27 at a process stage subsequent to that of FIGS. 31-33; and is a view along the cross-section of FIG. 26.

Referring to FIG. 34, construction 10b is shown at a processing stage analogous to that of FIG. 17. Specifically, electrically conductive lines 50, 52, 54 and 56 are formed across the domains 44 and 46 of material 42. The domains 44 are thus incorporated into electrical components 60 analogous to the electrical components discussed above with reference to FIG. 17, and the domains 46 introduce spatial material heterogeneity that substantially restricts lateral transport between adjacent domains 44. In some embodiments the heterogeneity provided by regions 46 electrically isolates adjacent electrical components from one another. In alternative processing, domains 46 may be selectively removed relative to domains 44 (e.g., with processing analogous to that described above with reference to FIGS. 19-21) prior to the formation of conductive lines 50, 52, 54 and 56.

The embodiments of FIGS. 1-34 utilize physical modifications of some surface regions of conductive material 16 to create the different surface configurations utilized to induce formation of different domains in a deposited material. In other embodiments chemical modifications of the surface regions of the conductive material may be utilized to create the different surface configurations, which will ultimately induce two or more domains to be formed in a deposited material. FIGS. 35-43 illustrate an example method for utilizing chemical modifications to create different surface configurations of a conductive material 16.

Figure 35:
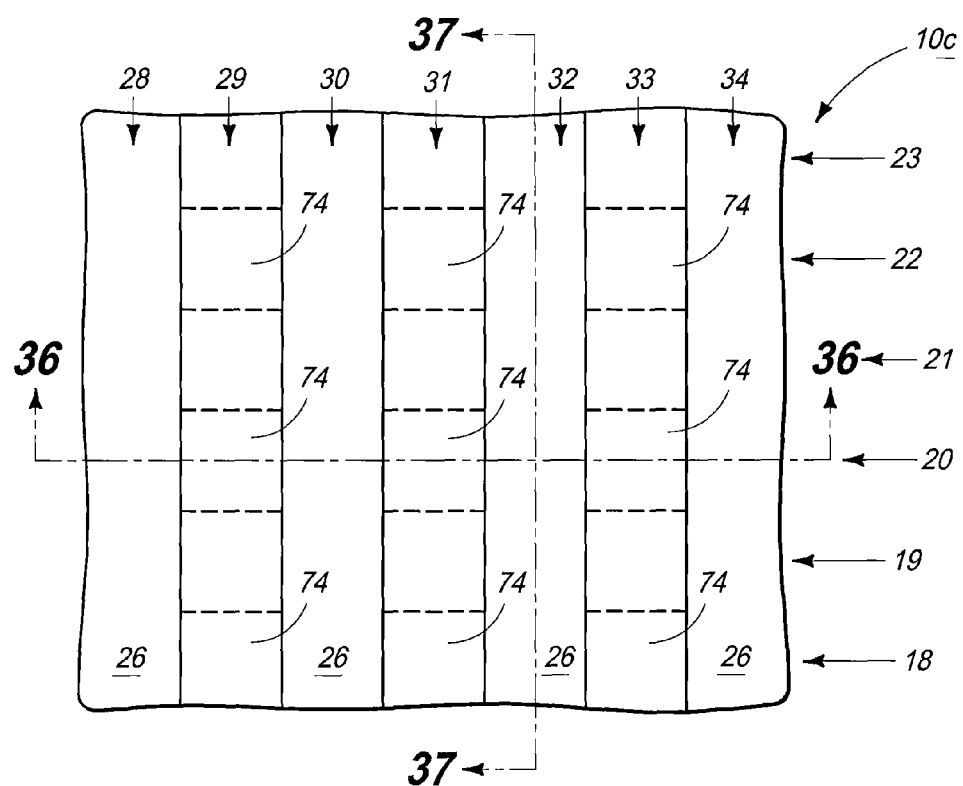
FIGS. 35-37 show a top view and cross-sectional side views of a portion of a semiconductor fragment at a process stage of another example embodiment method. The process stage of FIGS. 35-37 may follow that of FIGS. 4-6.
Figure 36:
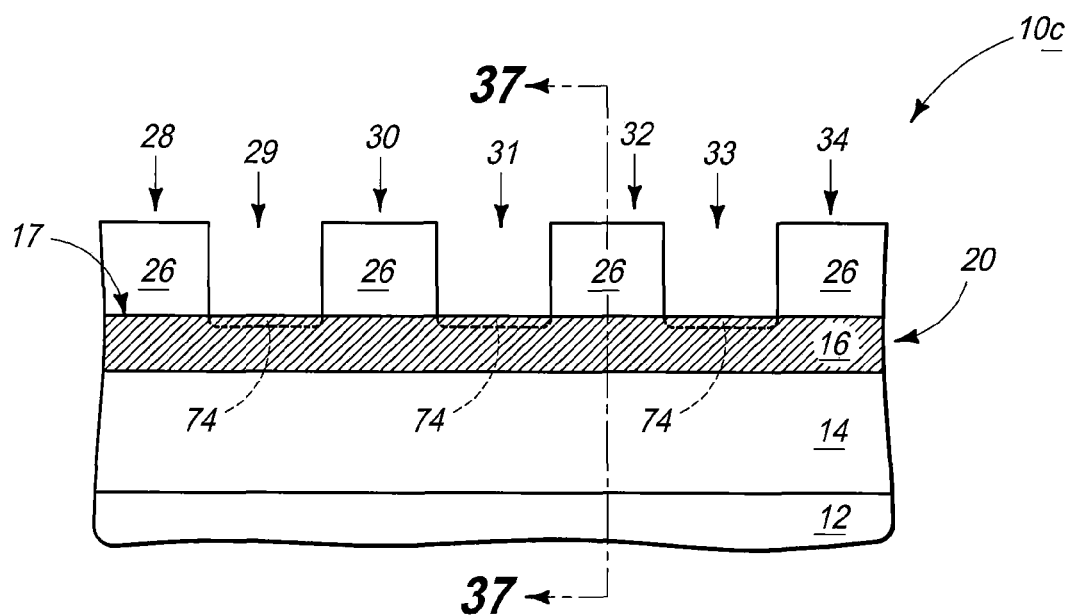
Figure 37:
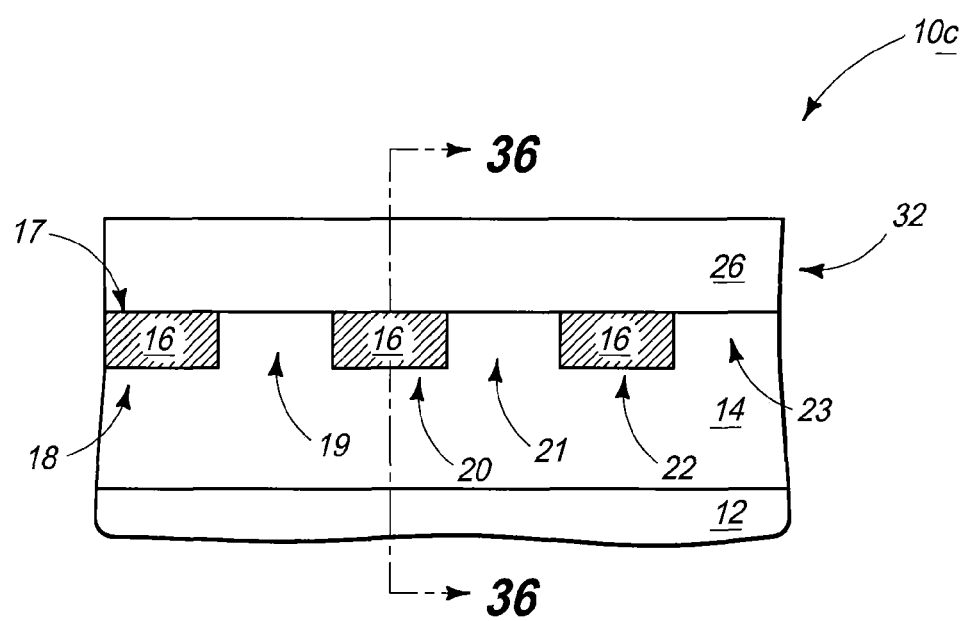

Referring to FIGS. 35-37, a construction 10c is illustrated at a processing stage subsequent to that of FIGS. 4-6. The construction includes the lines 28, 30, 32 and 34 of patterned masking material 26, with such lines being spaced from one another by the gaps 29, 31 and 33. Segments of the electrically conductive material 16 exposed within gaps 29, 31 and 33 are exposed to conditions which chemically modify such segments to thereby form the modified regions 74. The conditions may include, for example, implant of dopant into the exposed segments, surface adsorption, and/or chemical reaction of the exposed segments with one or more species (for instance, if conductive material 16 comprises metal the chemical reaction may form one or more of metal silicide, metal nitride, metal carbide, etc.).

In some embodiments the modified regions may be only along a surface of conductive material 16 (for instance, if the modified regions are formed by a surface reaction along the upper surface of material 16), while in other embodiments the modified regions may extend into conductive material 16 (for instance, if the modified regions are formed by implanting dopant into material 16, and/or if the modified regions are formed by a chemical reaction that penetrates into material 16). If the modified regions extend into material 16, they may extend entirely through the material in embodiments in which the modified regions are suitably conductive, or may extend only partially into the material.

Figure 38:
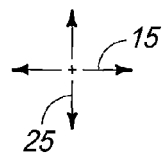
FIGS. 38-40 show a top view and cross-sectional side views of the portion of the semiconductor fragment of FIGS. 35-37 at a process stage subsequent to that of FIGS. 35-37.
Figure 38:
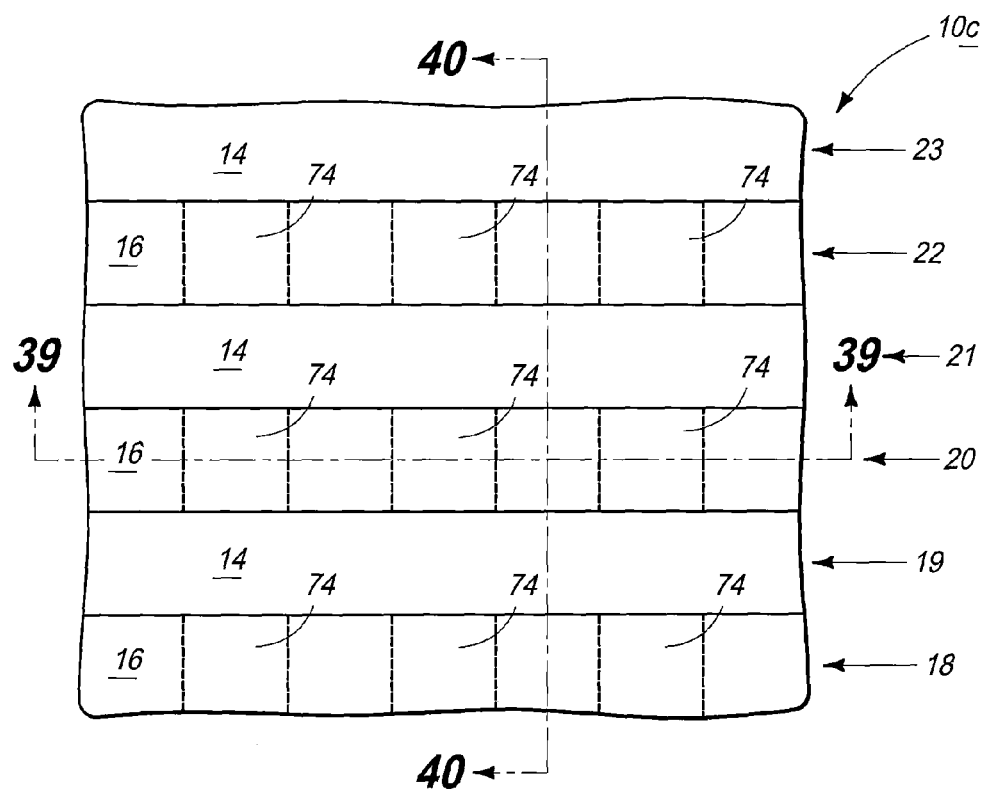
Figure 39:
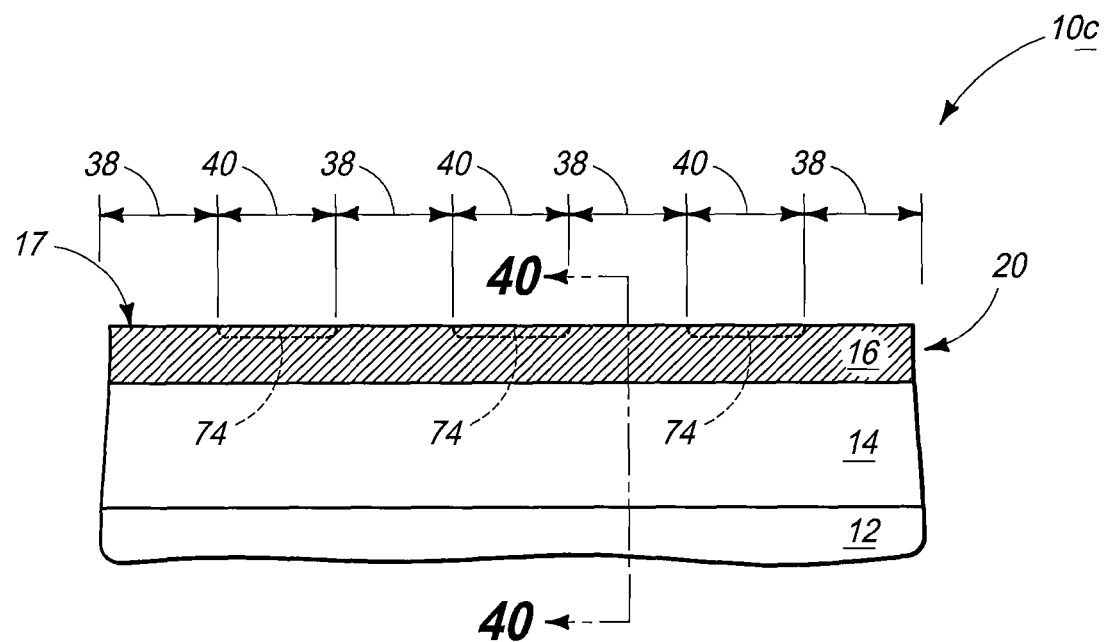
Figure 40:
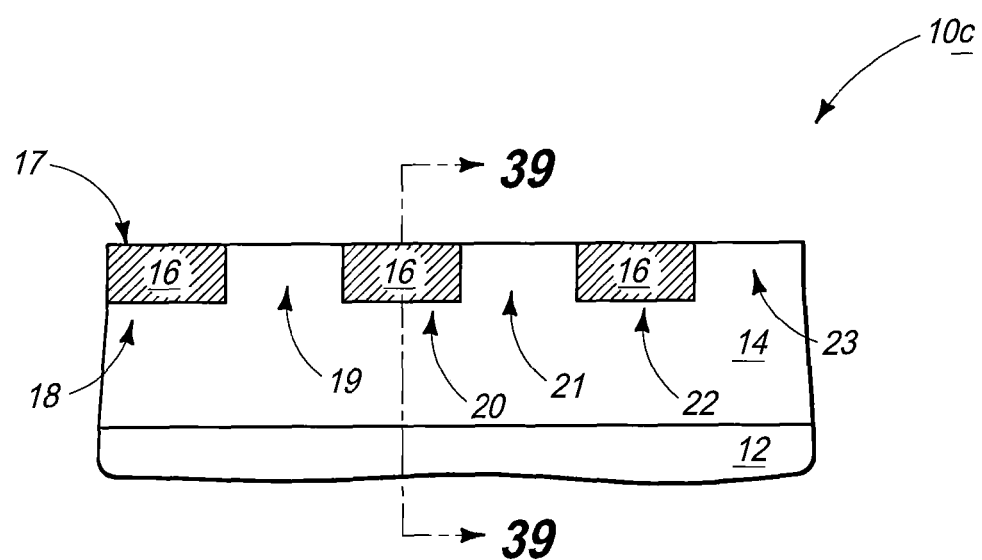

Referring to FIGS. 38-40, masking material 26 (FIGS. 35-37) is removed. After the removal of material 26, each of the conductive lines 18, 20 and 22 has an exposed upper surface comprising the two alternating configurations 38 and 40 (shown in FIG. 39 relative to the conductive line 20). The surface configuration 38 corresponds to the segments of the upper surfaces of material 16 that are not chemically modified, and the surface configuration 40 corresponds to the segments of the upper surfaces of material 16 that are within the chemically-modified regions 74.

Figure 41:
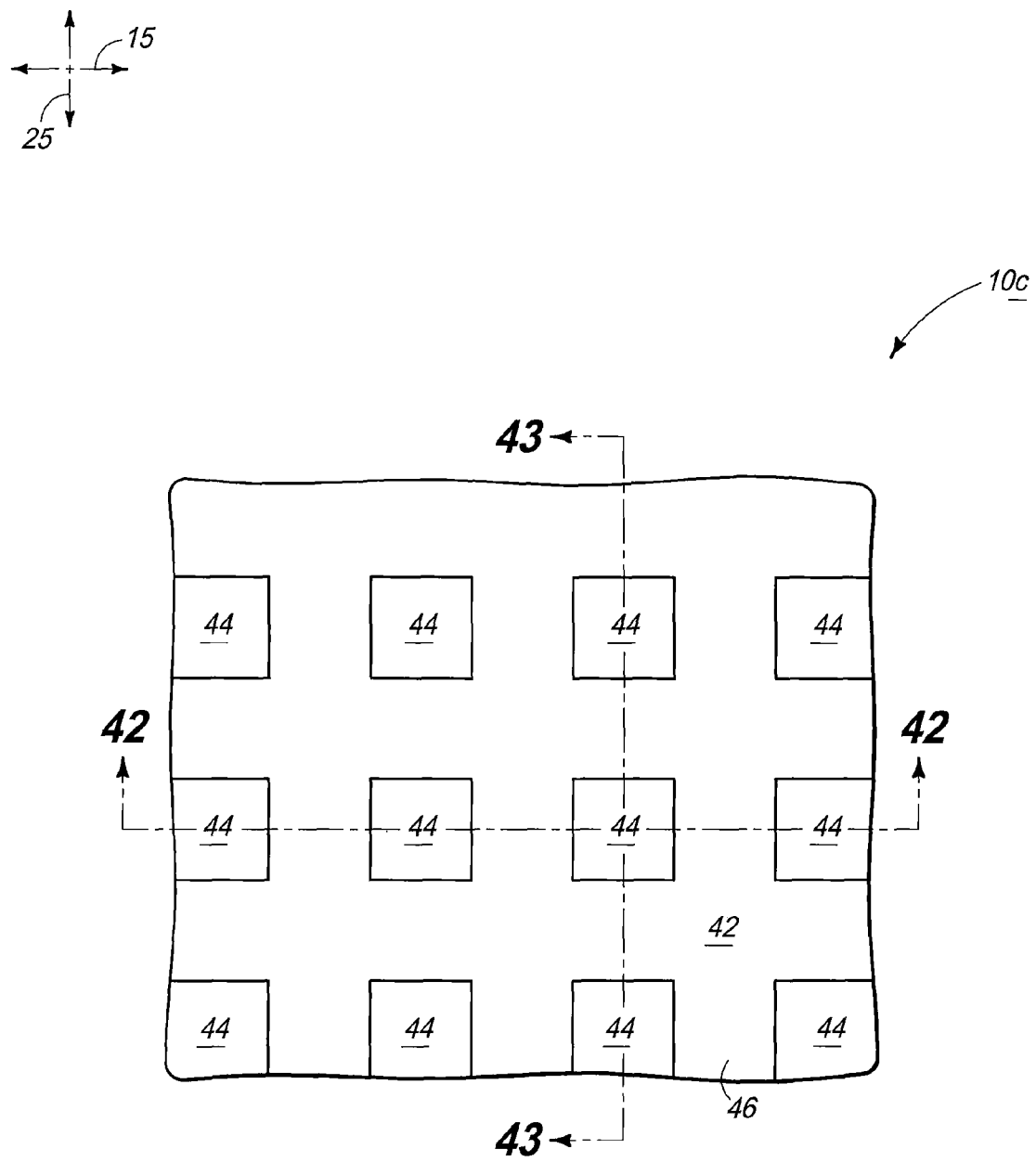
FIGS. 41-43 show a top view and cross-sectional side views of the portion of the semiconductor fragment of FIGS. 35-37 at a process stage subsequent to that of FIGS. 38-40.
Figure 42:
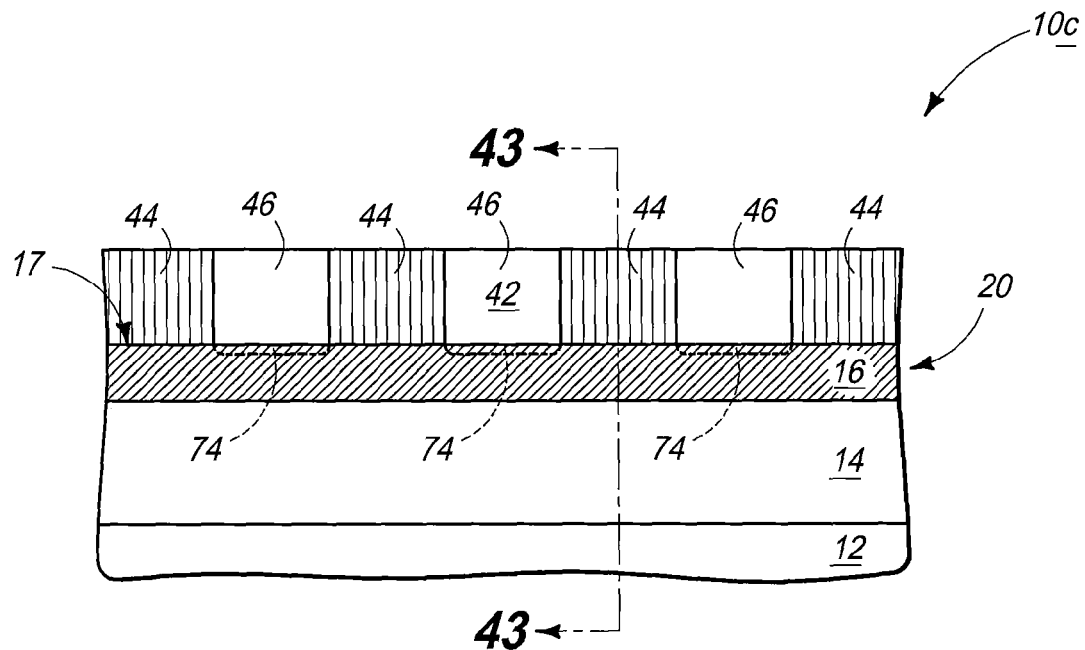
Figure 43:
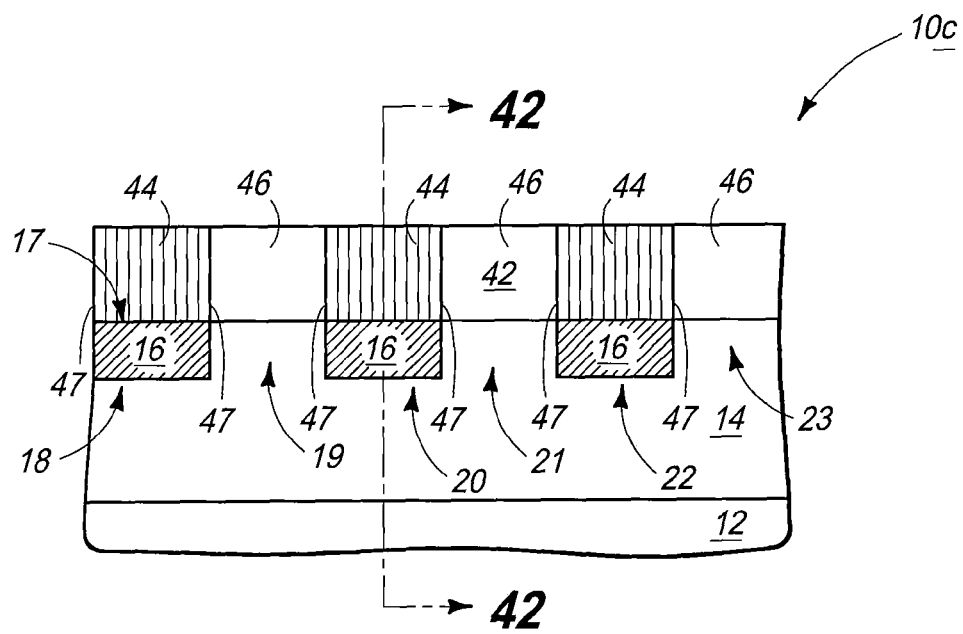

Referring to FIGS. 41-43, material 42 is formed over materials 14 and 16. The material is shown comprising the two different domains 44 and 46, with the domain 44 being induced by regions of conductive materials 18, 20 and 22 having the first surface configuration 38 (FIG. 39); and with domain 46 being induced by regions of conductive materials 18, 20 and 22 having the second surface configuration 40 (FIG. 39), and also being induced by surfaces of electrically insulative regions 19, 21 and 23. In subsequent processing (not shown) processing analogous to that described above with reference to FIGS. 16-18 may be conducted to form a series of conductive lines over material 42 and/or domains 46 may be selectively removed with processing analogous to that described above with reference to FIGS. 19-24.

Although the shown embodiment has domains 44 and 46 induced by non-chemically-modified surfaces and chemically-modified surfaces, respectively of conductive material 16, in other embodiments the reverse may occur such that it is domains 46 and 44 that are induced by the non-chemically-modified surfaces and chemically-modified surfaces, respectively.

In some embodiments chemical treatment analogous to that of FIGS. 35-43 may be used in combination with either of the roughening of FIGS. 7-9 or the trench formation of FIGS. 25-27.

In some embodiments the formation of multiple surface configurations across conductive material 16 may comprise formation of a coating across regions of the conductive material. Such coating formation may or may not be accompanied by chemical modification of material 16. FIGS. 44-52 illustrate an example embodiment for incorporating a coating into the formation of multiple surface configurations across conductive material 16.

Figure 44:
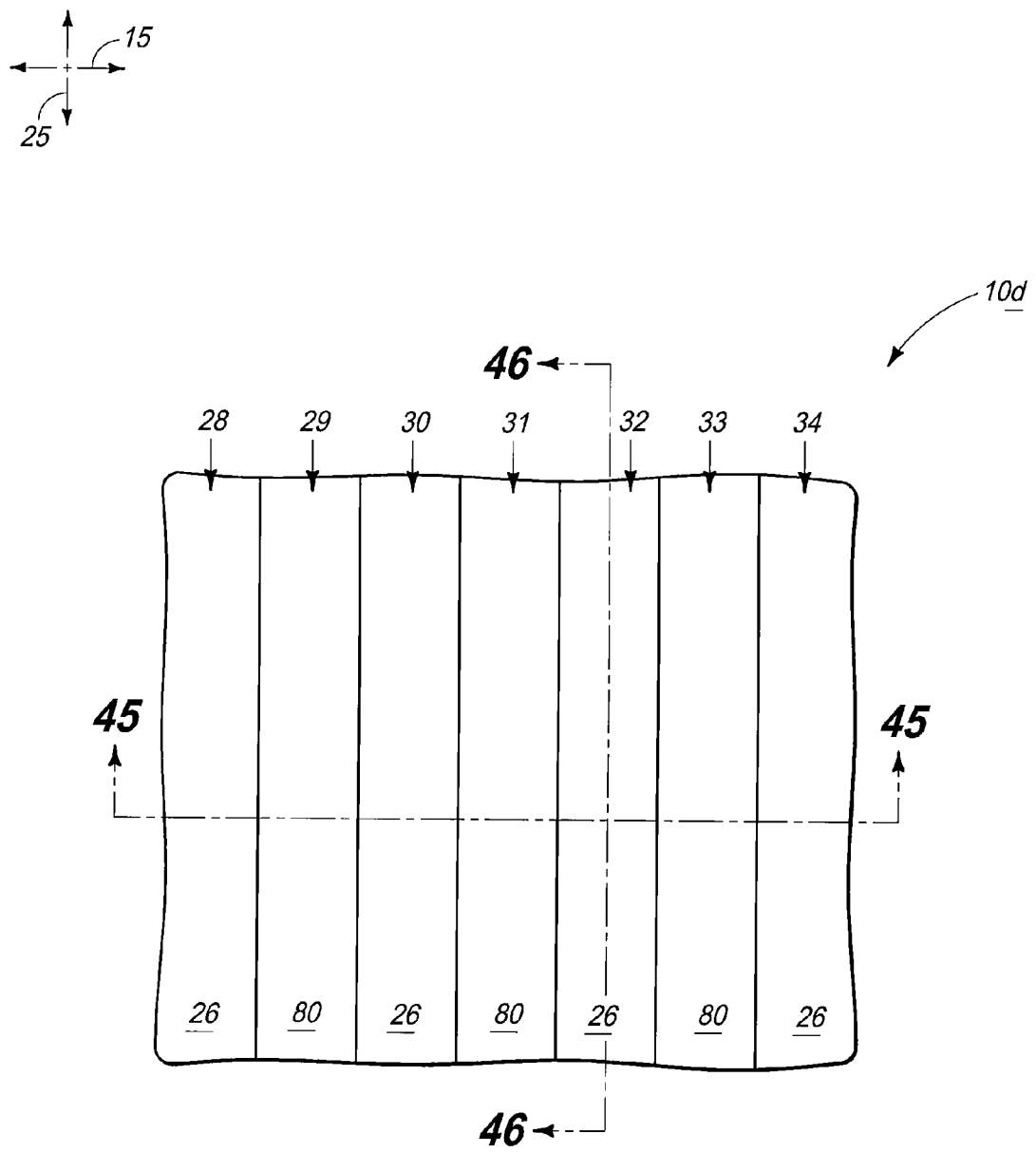
FIGS. 44-46 show a top view and cross-sectional side views of a portion of a semiconductor fragment at a process stage of another example embodiment method. The process stage of FIGS. 44-46 may follow that of FIGS. 4-6.
Figure 45:
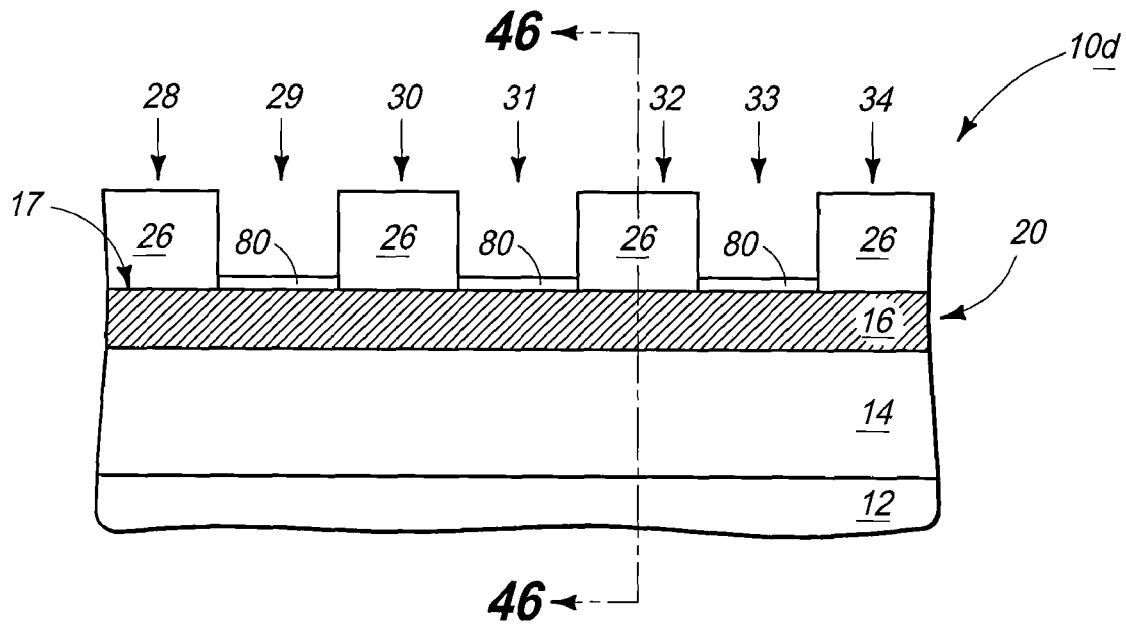
Figure 46:
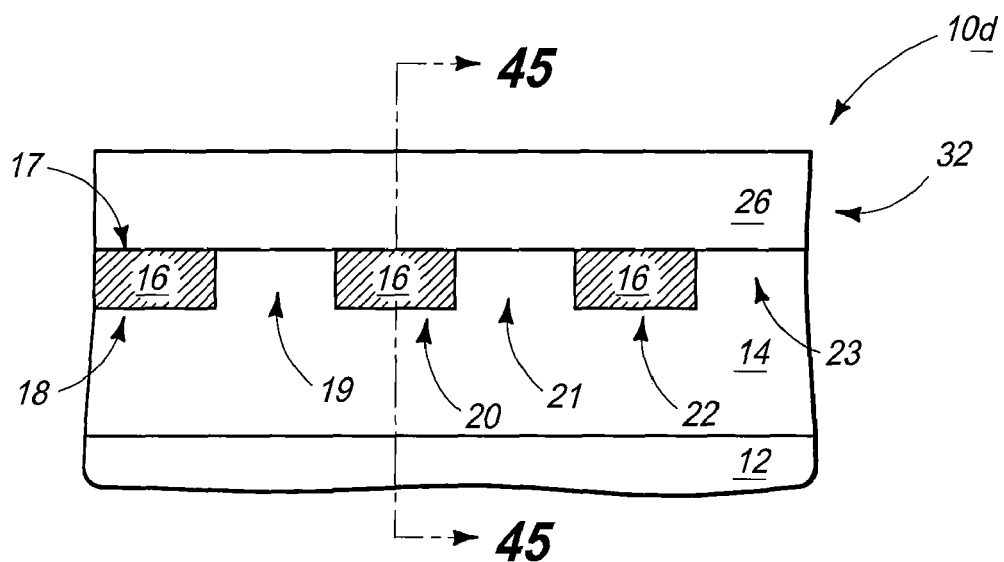

Referring to FIGS. 44-46, a construction 10*d* is shown at a processing stage subsequent to that of FIGS. 4-6. The construction includes the lines 28, 30, 32 and 34 of patterned masking material 26, with such lines being spaced from one another by the gaps 29, 31 and 33. A coating 80 is formed within gaps 29, 21 and 33. Coating 80 may comprise any suitable composition or combination of compositions, and in some embodiments will comprise, consist essentially of, or consist of electrically insulative material such as silicon dioxide and/or silicon nitride. Although coating 80 is shown formed non-selectively across both of materials 14 and 16, in some embodiments material 80 may be formed selectively only over material 16. The coating may or may not extend across masking material 26.

Figure 47:
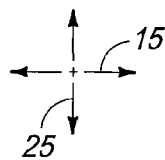
FIGS. 47-49 show a top view and cross-sectional side views of the portion of the semiconductor fragment of FIGS. 44-46 at a process stage subsequent to that of FIGS. 44-46.
Figure 47:
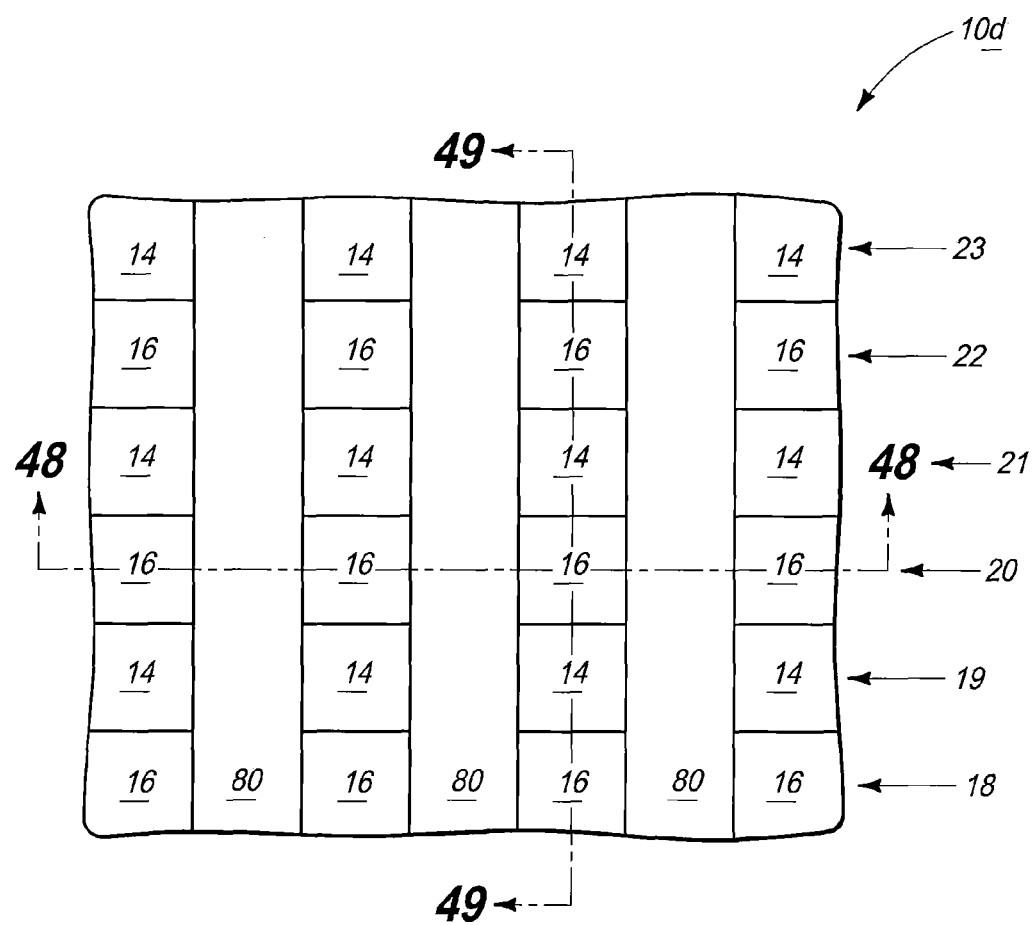
Figure 48:
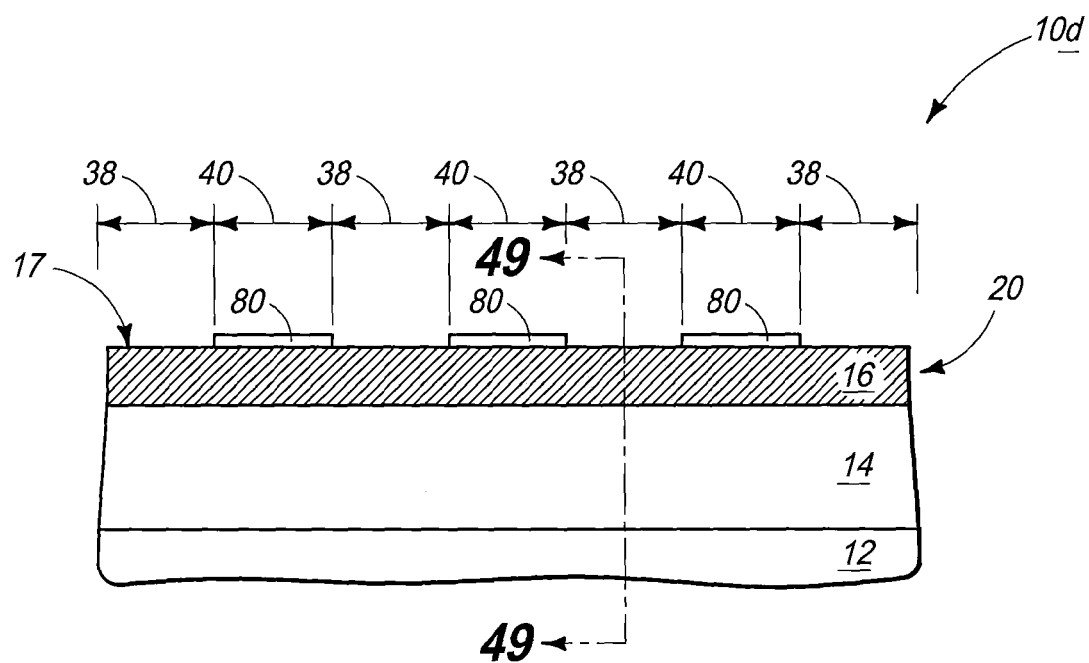
Figure 49:
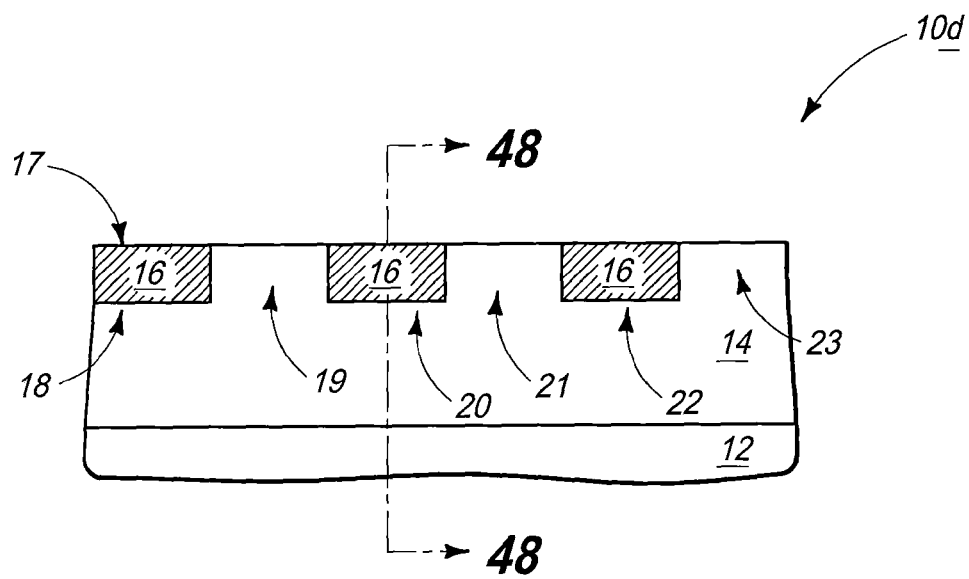

Referring to FIGS. 47-49, masking material 26 (FIGS. 44-46) is removed. After the removal of material 26, each of the conductive lines 18, 20 and 22 has two alternating surface configurations 38 and 40 (shown in FIG. 48 relative to the conductive line 20). The surface configuration 38 corresponds to the segments of material 16 that are not covered by coating 80, and the surface configuration 40 corresponds to the segments of the material 16 that are covered by coating 80.

Referring to FIGS. 50-52, material 42 is formed over materials 14 and 16. The material is shown comprising the two different domains 44 and 46, with the domain 44 being induced by the first surface configuration 38 (FIG. 48); and with domain 46 being induced by the second surface configuration 40 (FIG. 48), and also being induced by surfaces of electrically insulative regions 19, 21 and 23. In subsequent processing (not shown) processing analogous to that described above with reference to FIGS. 16-18 may be conducted to form a series of conductive lines over material 42 and/or domains 46 may be selectively removed with processing analogous to that described above with reference to FIGS. 19-24.

Although the shown embodiment has domains 44 and 46 induced by non-coated and coated surfaces, respectively, in other embodiments the reverse may occur such that it is domains 46 and 44 that are induced by the non-coated and coated surfaces, respectively.

The various processes discussed above may be utilized to form electrical components (such as memory devices, interconnects, diodes, etc.) suitable for incorporation into integrated circuitry. Such integrated circuitry may used in electronic systems. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a plurality of memory cells, comprising:
    forming a semiconductor substrate to have a first series of electrically conductive lines spaced from one another by dielectric regions; the electrically conductive lines of the first series extending primarily along a first direction; the substrate having an upper surface comprising surfaces of the electrically conductive lines;
    forming alternating first and second surface configurations along the surfaces of individual electrically conductive lines;
    forming memory cell material across the semiconductor substrate; the memory cell material comprising two or more domains; a first of the domains being induced by the first surface configuration, and a second of the domains being induced by the second surface configuration;
    forming a second series of electrically conductive lines over the memory cell material; the first domains of the memory cell material being in regions of the memory cell material that are directly between electrically conductive lines of the first series and the electrically conductive lines of the second series, and the second domains of the memory cell material being in regions of the memory cell material that are not directly between electrically conductive lines of the first series and the electrically conductive lines of the second series.

2. The method of claim 1 wherein the memory cell material is the only material directly between the electrically conductive lines of the first series and the electrically conductive lines of the second series.

3. The method of claim 1 wherein the forming the alternating surface configurations along surfaces of the individual conductive lines comprises roughening regions of the electrically conductive lines.

4. The method of claim 1 wherein the forming the alternating surface configurations along surfaces of the individual conductive lines comprises forming topological recessions that extend into the electrically conductive lines.

5. The method of claim 1 wherein the forming the alternating surface configurations along surfaces of the individual conductive lines comprises chemically modifying segments of the electrically conductive lines.

6. The method of claim 1 wherein the forming the alternating surface configurations along surfaces of the individual conductive lines comprises forming a coating across segments of the electrically conductive lines.

7. The method of claim 1 wherein the second domains of the memory cell material remain after forming the second series of electrically conductive lines.

8. The method of claim 1 wherein the second domains of the memory cell material are removed prior to forming the second series of electrically conductive lines.

9. The method of claim 1 wherein the first and second surface configurations have different texturing relative to one another, and are the same in chemical composition as one another.

10. The method of claim 1 wherein the first and second surface configurations have different texturing relative to one another, and are different from one another in chemical composition.

11. The method of claim 1 wherein:
    the upper surface of the semiconductor substrate also comprises surfaces of the dielectric regions; and
    wherein the forming of the alternating surface configurations along the surfaces of the individual electrically conductive lines also forms alternating surface configurations along the surfaces of the dielectric regions.

12. The method of claim 11 wherein the forming of the alternating surface configurations along the surfaces of the individual electrically conductive lines and along the surfaces of the dielectric regions comprises texturing the segments of the electrically conductive lines and the dielectric regions.

13. The method of claim 11 wherein the forming of the alternating surface configurations along the surfaces of the individual electrically conductive lines and along the surfaces of the dielectric regions comprises forming a coating over segments of the electrically conductive lines and the dielectric regions.

* * * * *